(12) United States Patent
Hartmann et al.

(10) Patent No.: US 7,771,630 B2
(45) Date of Patent: Aug. 10, 2010

(54) PRECISE FABRICATION OF POLYMER MICROLENS ARRAYS

(75) Inventors: Daniel M. Hartmann, La Jolla, CA (US); Sadik C. Esener, San Diego, CA (US); Osman Kibar, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 1359 days.

(21) Appl. No.: 09/792,236

(22) Filed: Feb. 23, 2001

(65) Prior Publication Data

US 2002/0027300 A1 Mar. 7, 2002

Related U.S. Application Data

(60) Provisional application No. 60/184,605, filed on Feb. 24, 2000.

(51) Int. Cl.
*B29D 11/00* (2006.01)
(52) U.S. Cl. .................. 264/1.38; 216/26; 264/1.7; 264/40.1; 264/305; 264/306; 427/162
(58) Field of Classification Search .................. 264/1.1, 264/1.7, 306, 1.36, 1.38, 305, 40.1; 216/24, 216/26; 427/163.2, 162, 164
See application file for complete search history.

(56) References Cited

U.S. PATENT DOCUMENTS 5,088,515 A 2/1992 Kamen (Continued)

FOREIGN PATENT DOCUMENTS

JP 04261501 9/1992

(Continued)

OTHER PUBLICATIONS

Taghizadeh, "Micro-optical Fabrication Technologies for Optical Interconnection Applications", *Diffractive Optics and Micro-Optics*, TOPS vol. 41, OSA Technical Digest, Postconference Edition, p. 260, Hotel Loews Le Concorde, Quebec City, Canada, Jun. 18-22, 2000.

(Continued)

*Primary Examiner*—Mathieu D. Vargot
(74) *Attorney, Agent, or Firm*—Perkins Coie LLP

(57) ABSTRACT

High performance microlens arrays are fabricated by (i) depositing liquid on the hydrophilic domains of substrates of patterned wettability by either (a) condensing liquid on the domains or (b) withdrawing the substrate from a liquid solution and (ii) optionally curing the liquid to form solid microlenses. The f-number ($f^\#$) of formed microlenses is controlled by adjusting liquid viscosity, surface tension, density, and index of refraction, as well as the surface free energies of the hydrophobic and hydrophilic areas. The f-number of formed microlenses is also adjustable by controlling substrate dipping angle and withdrawal speed, the array fill factor and the number of dip coats used. At an optimum withdrawal speed $f^\#$ is minimized and array uniformity is maximized. At this optimum, arrays of f/3.48 microlenses were fabricated using one dip-coat with uniformity better than $\Delta f/f \sim \pm 3.8\%$ while multiple dip-coats permit production of f/1.38 microlens arrays and uniformity better than $\Delta f/f \sim \pm 5.9\%$. Average $f^\#$s are reproducible to within 3.5%. The method is adaptable and extendible to precision parallel fabrication of (i) microlenses precisely sized, aligned and spatially positioned to various small light sources and optical fiber ends, (ii) conductive bump bonds on substrate pads, and (iii) conductive bonds between corresponding domains on separate perpendicular substrates, all of which are self-aligned.

9 Claims, 12 Drawing Sheets

U.S. PATENT DOCUMENTS

| | | | |
|---|---|---|---|
| 5,235,463 A | | 8/1993 | Broussoux et al. |
| 5,707,684 A | | 1/1998 | Hayes et al. |
| 5,723,176 A | * | 3/1998 | Keyworth et al. ......... 427/163.2 |
| 5,904,824 A | | 5/1999 | Oh |

FOREIGN PATENT DOCUMENTS

| WO | WO 01/62400 | 8/2001 |
|---|---|---|

OTHER PUBLICATIONS

Haney, "Micro- vs. macro-optics in free-space optical interconnects", *Diffractive Optics and Micro-Optics*, TOPS vol. 41, OSA Technical Digest, Postconference Edition, p. 266, Hotel Loews Le Concorde, Quebec City, Canada, Jun. 18-22, 2000.

Eitel, et al., "Highly Uniform Vertical-Cavity Surface-Emitting Lasers Integrated with Microlens Arrays", *IEEE Pothooks Technology Letters*, vol. 12, No. 5, pp. 459-461, May 2000.

Sharp, et al., "Microlens Arrays Meet Any Challenge", *Lasers & Optronics*, vol. 16, No. 12, pp. 21-23, Dec. 1997.

Wu, "Free-space integrated optics realized by surface-micromachining", *International Journal of High Speed Electronics and Systems*, vol. 8, No. 2, pp. 51-65, Jun. 1997.

Chang, et al., "Surface micromachined Devices for Microwave and Photonic Applications", *Proceedings of the SPIE—The International Society for Optical Engineering*, vol. 3419, pp. 214-226, Taipei, Taiwan, Jul. 9-11, 1998.

Traut, et al., "Holographically recorded gratings on microlenses for a miniaturized spectrometer array", *Optical Engineering*, vol. 39, pp. 290-298, Jan. 2000.

Eisner, et al., "Confocal microscopy with a refractive microlens—pinhole array", *Optics Letters*, vol. 23, No. 10, pp. 748-749, May 15, 1998.

Nussbaum, et al., "Design, fabrication and testing of microlens arrays for sensors and microsystems", *Pure and Applied Optics*, vol. 6, pp. 617-636, 1997.

Motamedi, et al., "Micro-optic integration with focal plane arrays", *Optical Engineering*, vol. 36, No. 5, pp. 1374-1381, May 1997.

Cox, et al., "Fabrication of micro-optics by microjet printing", *SPIE*, vol. 2383, pp. 110-115, Feb. 7-9, 1995.

Kufner, et al., "Micro-optics in Photosensitive Glass", *Micro-optics and lithography*, pp. 81-118, and 183-184, VUBPRESS, Brussels, Belgium, 1997.

Hutley, "Refractive Lenslet Arrays", *Micro-optics, Elements, systems and applications*, pp. 127-152, edited by Hans Peter Herzig, Taylor & Frances, Ltd., Bristol, Pennsylvania, 1997.

Sinzinger, et al., "Refractive Microoptics", *Microoptics*, pp. 85-127, Wiley-VCH, Weinheim, 1999.

Hartmann, et al., "Characterization of a polymer microlens fabricated by use of the hydrophobic effect", *Optics Letters*, vol. 25, No. 13, pp. 975-977, Jul. 1, 2000.

Heremans, et al., "Mushroom Microlenses: Optimized Microlenses by Reflow of Multiple Layers of Photoresist", *IEEE Photonics Technology Letters*, vol. 9, No. 10, pp. 1367-1369, Oct. 1997.

Park, et al., "Microlens for Efficient Coupling Between LED and Optical Fiber", *IEEE Photonics Technology Letters*, vol. 11, No. 4, pp. 439-441, Apr. 1999.

Kufner, et al., "Fabrication of monolithic integrated fiber-lens connector arrays by deep proton irradiation", *Microsystem Technologies*, vol. 2, pp. 114-118, 1998.

Kim, et al., "Use of Minimal Free Energy and Self-Assembly To Form Shapes", *Chem. Mater.*, vol. 7, pp. 1257-1264, 1995.

Presby, et al., "Laser micromachining of efficient fiber microlenses", *Applied Optics*, vol. 29, No. 18, pp. 2692-2695, Jun. 20, 1990.

Malki, et al., "Microlenses-fibers fabricated by melting-tapering process using $CO_2$ laser", *Proceedings of SPIE, The International Society for Optical Engineering*, vol. 3740, pp. 432-437, Yokohama, Japan, Jun. 16-18, 1999.

Rode, et al., "Self-Aligned Positioning of Microoptical Components by Precision Prismatic Grooves Impressed into Metals", *IEEE Journal of Microelectromechanical Systems*, vol. 8, No. 1, pp. 58-64, Mar. 1999.

Aoki, et al., "Micro-optical bench for alignment-free optical coupling", *Applied Optics*, vol. 38, No. 6, pp. 963-965, Feb. 20, 1999.

Peter, et al., "XY-stage for alignment of optical elements in MOEMS", *Proceedings of SPIE, The International Society for Optical Engineering*, vol. 3513, pp. 202-209, Santa Clara, California, Sep. 21-22, 1998.

Wilbur, et al., "Microcontact printing of self-assembled monolayers: applications in microfabrication", *Nanotechnology*, vol. 7, pp. 452-457, 1996.

Biebuyck, et al., "Self-Organization of Organic Liquids on Patterned Self-Assembled Monolayers of Alkanethiolates on Gold", *Langmuir*, vol. 10, pp. 2790-2793, 1994.

Kim, et al., "Combining Patterned Self-Assembled Monolayers of Alkanethiolates on Gold with Anisotropic Etching of Silicon to Generate Controlled Surface Morphologies", *J. Electrochem. Soc.*, vol. 142, No. 2, pp. 628-633, Feb. 1995.

Braun, et al., "Thin microstructured polymer films by surface-directed film formation", *Thin Solid Films*, vol. 345, pp. 222-228, 1999.

Huang, et al., "Selective deposition of films of polypyrrol, polyaniline and nickel on hydrophobic/hydrophilic patterned surfaces and applications", *Synthetic Metals*, vol. 85, pp. 1375-1376, 1997.

Schwartz, et al., "Hysteretic Effects in Droplet Motions on Heterogeneous Substrates: Direct Numerical Simulation", *Langmuir*, vol. 14, pp. 3440-3453, 1998.

Schwartz, et al., "Simulation of Droplet Motion on Low-Energy and Heterogeneous Surfaces", *Journal of Colloid and Interface Science*, vol. 202, pp. 173-188, 1998.

Landau, et al., "Dragging of a Liquid by a Moving Plate", *Acta Physiochimica, URSS*, vol. XVII, No. 1-2, pp. 42-54, 1942.

Hocking, et al., "Sliding and Spreading of Thin Two-Dimensional Drops", *The Ouarterly Journal of Mechanics and Applied Mathematics*, vol. XXXIV, Part I, pp. 37-55, Feb. 1981.

Thompson, et al., "A general boundary condition for liquid flow at solid surfaces", *Nature*, vol. 389, pp. 360-362, Sep. 1997.

Barrat, et al., "Large Slip Effect at a Nonwetting Fluid-Solid Interface", *Physical Review Letters*, vol. 82, No. 23, pp. 4671-4674, Jun. 7, 1999.

Widom, et al., "Line Tension and the Shape of a Sessile Drop", *J. Phys. Chem.*, vol. 99, pp. 2803-2806, 1995.

Pellicer, et al., "The physical description of elementary surface phenomena: Thermodynamics versus mechanics", *American Journal of Physics*, vol. 63, No. 6, pp. 542-547, Jun. 1995.

Behroozi, et al., "The profile of a dew drop", *American Journal of Physics*, vol. 64, No. 9, pp. 1120-1125, Sep. 1996.

Hartmann, et al., "Polymer Microlens Arrays Fabricaed Using the Hydrophobic Effect", *Otpics in Computing 2000*, vol. 4089, pp. 496-507, Quebec City, Canada, Jun. 18-23, 2000.

International Preliminary Examination Report dated May 28, 2002 and International Search Report dated Oct. 11, 2001 for PCT/US01/06261, filed Feb. 24, 200, published as WO 01/62400, and entitled: "Precision Fabrication Of Diverse Polymer Microstructures By Use Of The Hydrophobic Effect" (7 pages total).

Bowden, N. et al., "Self-Assembly of Mesoscale Objects into Ordered Two-Dimensional Arrays," *Science*, vol. 276, pp. 233-235 (Apr. 1997).

Cho, Gyoujin et al., "Ultra-thin zeolite films through simple self-assembled processe,", *Advanced Materials*, vol. 11 (No. 6), pp. 497-499 (1999).

Daoura, M. J. and D.R. Meldrum, "Precise automated control of fluid volumes inside glass capillaries," *Journal of Microelectromechanical Systems*, vol. 8, (No. 1), pp. 71-77 (Mar. 1999).

Doane, Daryl Ann and P.D. Franzon, *Multichip Module Technologies and Alternatives: The Basics*, New York: Van Nostrand Reinhold, (1993) pp. 433-439.

Drelich, J. et al., "Wetting Characteristics of liquid drops at heterogeneous surfaces," *Colloids and Surfaces A: Physicochemical and Engineering Aspects*, vol. 93. pp. 1-13 (1994).

Estes, Richard H. and Frank W. Kulesza, "Conductive Adhesive Polymer Materials in Flip Chip Applications," Chapter 6 in *Flip Chip Technologies*, John H. Lau (Editor), New York: McGraw-Hill, pp. 223-267 (1995).

Gau, H. et al. "Liquid Morphologies on Structured Surfaces: From Microchannels to Microchips," Science, vol. 283, pp. 46-49 (Jan. 1999).

Greve, D. R. et al., "Directed self-assembly of amphiphilic regioregular polythiophenes on the nanometer scale," Synthetic Metals, vol. 102, pp. 1502-1505 (1999).

Handique, K. et al., "Microfluidic flow control using selective hydrophobic patterning," Proceedings of the SPIE, vol. 3224 (Micromachined Devices and Components III), pp. 185-195 (1997).

Handique, K. et al. "Nanoliter-volume discrete drop injection and pumping in microfabricated chemical analysis systems," Technical Digest. Solid-State Sensor and Actuator Workshop, Hilton Head Island, South Carolina, Jun. 8-11, 1998, pp. 346-349, Cleveland, Ohio: Transducers Research Foundation.

Hartmann, D.M. et al., "Microlenses self-aligned to optical fibers fabricated using the hydrophobic effect," IEEE Photonics Technology Letters, vol. 13, Issue 10, pp. 1088-1090 (Oct. 2001).

Hartmann, D.M. et al., "Optimization and theoretical modeling of polymer microlens arrays fabricated with the hydrophobic effect," Applied Optics, vol. 40, Iss. 16, pp. 2736-2746 (Jun. 2001).

Hayes, D.J. et al., "Picoliter solder droplet dispensing," Microelectronics and Electronic Packaging, vol. 16, No. 3, pp. 173-180 (1993).

Herminghaus et al., "Liquid microstructures at solid interfaces," J. Phys.: Condens. Matter 12: A57-A74 (2000).

Herminghaus et al., "Artificial Liquid Microstructures," Advanced Materials, 11(6): 1393-1395 (1999).

Houston, M. R. et al., "Self-assembled monolayer films as durable anti-stiction coatings for polysilicon microstructures," Technical Digest. Solid-State Sensor and Actuator Workshop, Hilton Head Island, South Carolina, Jun. 2-6, 1996, pp. 42-47, Cleveland, Ohio: Transducers Research Foundation.

Iverson, W.R.; "Liquid solder jetting attracts U. S. research," Assembly Magazine, pp. 27-30 (Mar. 1994).

Jones, D.K. et al., "Selective hydrophobic and hydrophilic texturing of surfaces using photolithographic photodeposition of polymers," Proceedings of the SPIE Conference on Microfluidic Devices and Systems, Santa Clara, California, Sep. 21-22, 1998, vol. 3515, pp. 136-143.

Karim, A. et al., "Phase separation of ultrathin polymer-blend films on patterned substrates," Physical Review E, vol. 57 (No. 6), pp. R6273-R6276 (Jun. 1998).

Kumar, A. and G. M. Whitesides, "Patterned Condensation Figures as Optical Diffraction Gratings," Science, vol. 263, No. 5143, pp. 60-62 (Jan. 7, 1994).

Kumar, A. et al., "The use of self-assembled monolayers and a selective etch to generate patterned gold features," Journal of the American Chemical Society, vol. 114 (No. 23), pp. 9188-9189 (1992).

Kumar, A., "Features of gold having micrometer to centimeter dimensions can be formed through a combination of stamping with an elastomeric stamp and an alkanethiol "ink" followed by chemical etching," Applied Physics Letters, vol. 63, No. 14 (1993), pp. 2002-2004 (Oct. 4, 1993.

Lenz, Peter and Reinhard Lipowsky, "Morphological Transitions of Wetting Layers on Structured Surfaces," Physical Review Letters, vol. 80, No. 9, pp. 1920-1923 (Mar. 2, 1998).

Lopez, G.P. et al., "Imaging of Features on Surfaces by Condensation Figures," Science, vol. 260, No. 5108, pp. 647-649 (Apr. 30, 1993).

Möller, G. et al, "Controlling Microdroplet Formation by Light," Langmuir, vol. 14, No. 18, pp. 4955-4957 (1998).

Sastry, M. et al.,"Organization of polymer-capped platinum colloidal particles at the air-water interface," Thin Solid Films, vol. 324, (No. 2), pp. 239-244 (1998).

Wang, R. et. al, "Light-induced amphiphilic surfaces," Nature, vol. 388, pp. 431-432 (1997).

Westcott, S.L. et al., "Formation and adsorption of clusters of gold nanoparticles onto functionalized silica nanoparticle surfaces," Langmuir, vol. 14, (No. 19), pp. 5396-5401 (1998).

Welters, W.J.J. and L.G.J. Fokkink, "Fast Electrically Switchable Capillary Effects," Langmuir, vol. 14, No. 7, pp. 1535-1538 (1998).

Zengerle, R. et al., "Carbon dioxide priming of micro liquid systems," Proceedings of the IEEE Micro Electro Me hanical Systems (MEMS '95) Amsterdam, Netherlands, Jan. 29-Feb. 2, 1995 pp. 340-343.

* cited by examiner

Table 1: Minimum $f^\#$ and the speed at which the minimum $f^\#$ is formed for several monomer solutions and a glycerol solution. (500 μm diameter lenses, array fill factor ~0.25)

| Monomer Name | Viscosity (cP) | Surface Tension (dynes/cm) | Speed at which lens height is maximized ($f^\#$ is minimized) (μm/s) | Maximum lens sag height (μm) & minimum $f^\#$ |
|---|---|---|---|---|
| Sartomer SR238 | 9 | 35.7 | >7500 | 34 μm / 3.8 |
| Sartomer SR492 | 90 | 34.0 | 1420 | 37 μm / 3.4 |
| Sartomer CD541 | 440 | 35.3 | 680 | 50 μm / 2.6 |
| Sartomer SR601 | 1080 | 36.6 | 340 | 54 μm / 2.4 |
| Glycerol / H₂O* | 450 | ~63.4 | ~4600 | 61 μm / 2.2 |

\* A solution of 94% glycerol, 6% H₂O was used. This mixture was chosen because it has a viscosity approximately equal to that of Sartomer CD541

FIG. 3

FIG. 8a
FIG. 8b
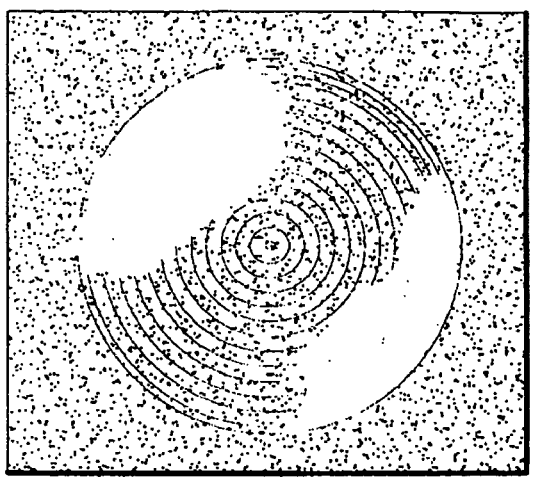
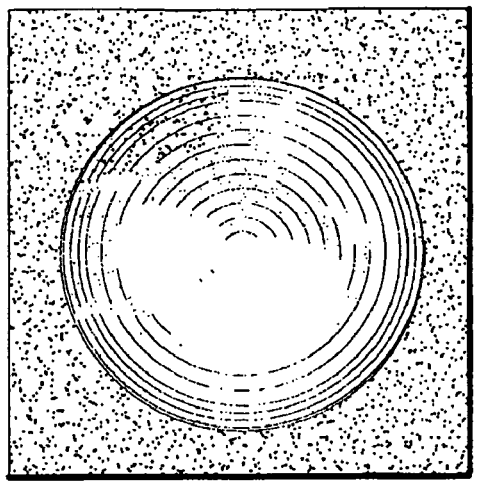
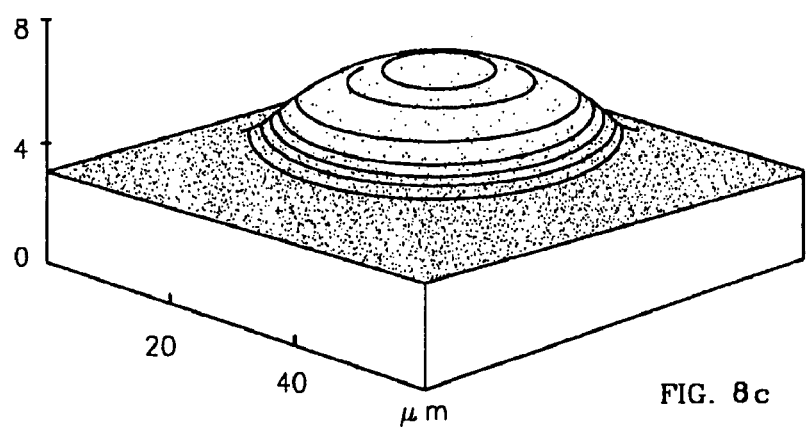
FIG. 8c
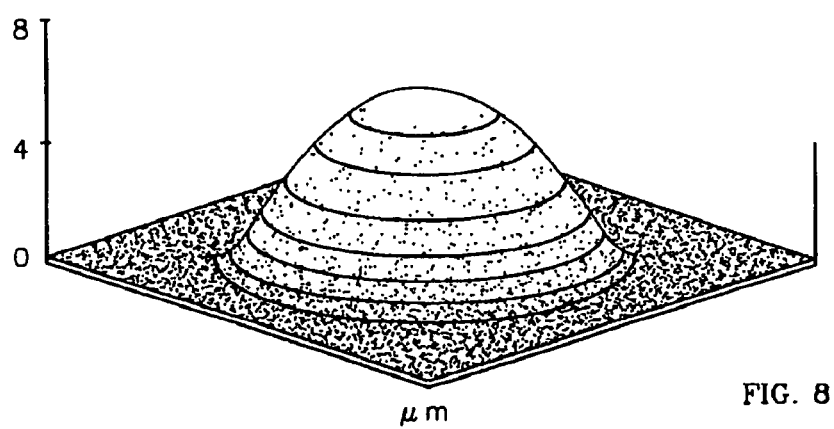
FIG. 8d

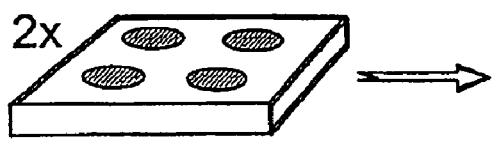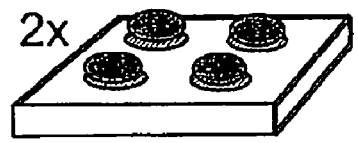
FIG. 14a
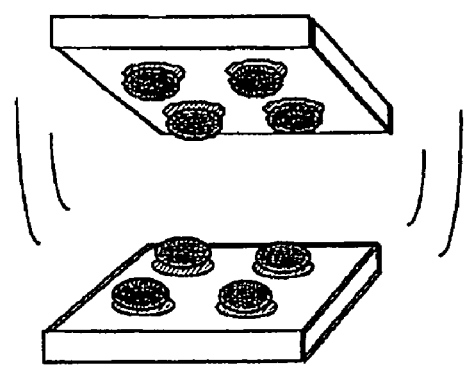
FIG. 14b
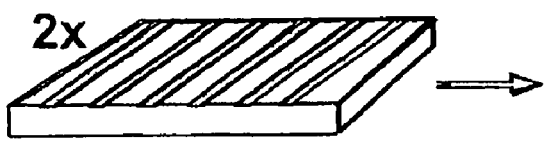
FIG. 15a
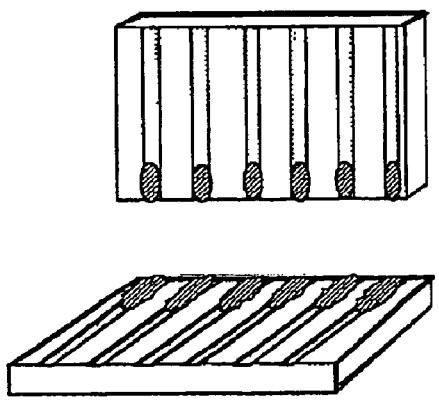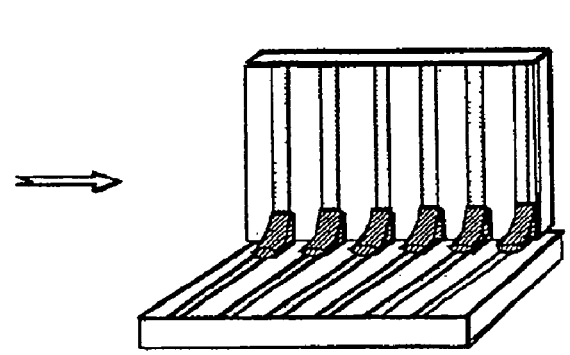
FIG. 15b

PRECISE FABRICATION OF POLYMER MICROLENS ARRAYS

RELATION TO A PROVISIONAL PATENT APPLICATION

The present patent application is descended from, and claims benefit of priority of, U.S. provisional patent application Serial No. 60/184,605 filed on Feb. 24, 2000, for LOW COST, ACCURATE PATTERNING OF HYDROPHOBIC MATERIALS TO ALLOW THE ASSEMBLY OF ORGANIC AND INORGANIC COMPONENTS ON A SUBSTRATE to the selfsame inventors as the present patent application.

This invention was made by support of the U.S. Government under Grant No. DARPA-HOTC MDA 972-98-1-0001 (Defense Advanced Research Project Agency—Heterogeneous Optoelectronic Technology Center) acting through the United States Defense Advanced Research Project Agency (DARPA). The U.S. Government has certain rights in this invention.

BACKGROUND OF THE INVENTION

1. Field of the Invention

The present invention generally concerns (i) microstructures including optical microlenses and electrical bump bonds; (ii) liquids (and especially liquid monomers that may be cured to form polymers) and the use of such liquids in the fabrication of microstructures; and (iii) the use of hydrophobic and hydrophilic effects in the fabrication of microstructures, including optical microlenses, electrical bump bonds, and electrical bonds between mutually perpendicular chips.

The present invention particularly concerns the precision fabrication of, inter alia, (i) high performance transparent polymer optical microlenses and microlens arrays, including as may be either arrayed or aligned, including self-aligned, to the ends of optical fibers, and, separately by an analogous process, (ii) electrically conductive polymer bump bonds, and conductive bump bonds self-aligned to bump pads, and, separately by an analogous process, (iii) bonds between mutually perpendicular substrates.

In all areas (i)-(iii) the present invention still more particularly concerns microlens or bump bond or substrate(s) bond fabrication by (1) transfer of a liquid polymer precursor onto hydrophilic domains of a substrate of patterned wettability followed by (2) curing of the polymer; said (1) transfer of liquid being realized either by (1a) condensing the liquid onto these hydrophilic domains or (1b) withdrawing substrates of patterned wettability from a liquid solution at controlled speed and said (2) curing being realized by (2a) heat, (2b) chemical reaction or (2c) ultraviolet light.

In area (i) the present invention still more particularly concerns aligning microlenses to optical components, and the direct fabrication of microlenses on optical components.

Also in the area (i) the present invention still more particularly concerns the low cost fabrication of microlenses that are self-aligned to optical fibers and/or low-wavelength (<500 nm) single-mode light output devices, including microlenses as may be fabricated both (i) directly upon these fibers or components or (ii) in a precisely spaced and oriented relationship thereto.

In the area (ii), the electrically conductive polymer bump bonds—the fabrication of which is an area of the present invention—may still more particularly be (i) arrayed and/or (ii) self-aligned, by the use of hydrophobic and hydrophilic effects.

Likewise in the area (iii), the electrically conductive bonds between perpendicular substrates—the fabrication of which is another area of the present invention—may still more particularly be (i) arrayed and/or (ii) self-aligned, to either or to both substrates by the use of hydrophobic and hydrophilic effects.

2. Description of the Prior Art

2.1 Microlenses

In today's world (circa 2001) of information processing, the role of arrayed optics is becoming more and more important as the need for parallelism and density increases in each of display, communication, and storage applications. The trend towards highly parallel compact optical systems has in particular lead to a growing need for high-performance, low f-number (f#), microlens arrays.

Refractive microlenses have been utilized in hybrid optical interconnect strategies. See, for example, M. R. Taghizadeh "Micro-optical fabrication technologies for optical interconnection applications", in Diffractive Optics and Micro-Optics, OSA Technical Digest, 260 (2000); M. W. Haney "Micro- vs. macro-optics in free-space optical interconnects" in Diffractive Optics and Micro-Optics, OSA Technical Digest, 266 (2000); S. Eitel, S. J. Fancey, H. P. Gauggel, K. H. Gulden, W. Bachtold, M. R. Taghizadeh, "Highly uniform vertical-cavity surface-emitting lasers integrated with microlens arrays", IEEE Photonics Technology Letters 12, IEEE,. 459-61 (2000); and G. Sharp, L. E. Schmutz, "Microlens arrays meet any challenge", Lasers & Optronics Lasers Optronics (USA) 16, 21-3 (1997).

Refractive microlenses have also been used in switching networks. See, for example, M. C. Wu, L. Y. Lin, S. S. Lee, C. R. King, "Free-space integrated optics realized by surface-micromachining", International Journal of High Speed Electronics and Systems 8, World Scientific, 283-97 (1997); and M. F. Chang, M. C. Wu, J. J. Yao, M. E. Motamedi, "Surface micromachined devices for microwave and photonic applications", Proceedings of the SPIE—The International Society for Optical Engineering, (Optoelectronic Materials and Devices) 3419, M. Osinski, Y. Su, chairs/editors, 214-26 (1998).

Refractive microlenses have further been used in spectrophotometry. See, for example, S. Traut, H. P. Herzig, "Holographically recorded gratings on microlenses for a miniaturized spectrometer array", Optical Engineering 39, 290-8 (2000).

Refractive microlenses have still further been used in confocal microscopy. See, for example, M. Eisner, N. Lindlein, J. Schwider, "Confocal microscopy with a refractive microlens-pinhole array", Optics Letters 23, 748-9 (1998).

Refractive microlenses have yet still further been used in sensors. See, for example, P. Nussbaum, R. Volkel, H. P. Herzig, M. Eisner, S. Haselbeck, "Design, fabrication and testing of microlens arrays for sensors and Microsystems", Pure and Applied Optics 6, 617-36 (1997).

Refractive microlenses have yet still further been used in focal plane arrays. See, for example, M. E. Motamedi, W. E. Tennant, H. O. Sankur, R. Melendes, N. S. Gluck, S. Park, J. M. Arias, J. Bajaj, J. G. Pasko, W. V. McLevige, M. Zandian, R. L. Hall, P. D. Richardson, "Micro-optic integration with focal plane arrays", Optical Engineering 36, 1374-81 (1997).

Finally, refractive microlenses have been used in photolithography. See, for example, P. Nussbaum, R. Volkel, H. P. Herzig, M. Eisner, S. Haselbeck, "Design, fabrication and testing of microlens arrays for sensors and Microsystems", Pure and Applied Optics 6, 617-36 (1997).

In general, increasing applications for micro-optical elements present increasing applications for microlenses, and microlens arrays. To address this expanding need for microlenses, fabrication technologies would desirably be identified that will permit precision microlens arrays to be constructed at low cost. In addition, these microlens arrays must be reliably uniform and reproducible so that they can be incorporated seamlessly into existing optical architectures and systems.

2.1.1 Fabrication of Arrays of Microlenses by Other Than Hydrophobic Processes

At present, there are several methods used to form arrays of refractive microlenses. The most viable of these techniques include: (1) dispensed droplets, (2) thermal reflow, and (3) photothermal expansion. A brief description of each of these techniques follows:

In the dispensed droplets technique a modified ink-jet printer, or other dispensing mechanism is used to dispense precise volumes of a polymer material into an array of droplets which can serve as microlenses.

The dispensed droplet technique for fabricating microlens arrays does not utilize a lithographic step, and hence suffers from drawbacks in accuracy. Because of limitations in fluid-handling control, microlenses fabricated with this technique have relatively large minimum diameters (typical values today ~70 um). The pitch of the lenses must also be relatively large, to avoid overlap. Also, the footprints of the lenses thus created are always circular, unless the substrate is pre-patterned, or a special curing process is employed. Another drawback to the technique of dispensed droplets is that it typically requires heating of the dispensed material, making it incompatible with some heat-sensitive materials. In it's defense, the technique requires very little characterization, and few processing steps, making it low-cost. See for example W. R. Cox, D. J. Hayes, T. Chen, and D. W. Ussery, "Fabrication of micro-optics by microjet printing", SPIE Vol. 2383, pp. 110-115.

In the thermal reflow technique a substrate is coated with a layer of photoresist. The resist is patterned to form an array of resist "islands". The substrate is then heated until the resist melts and surface tension draws the islands of resist into the shape of the lenses. If desired, this pattern can then be transferred to the underlying substrate with a reactive ion etch (RIE). Gray scale masks can be used to further extend the capabilities of the thermal reflow process. The use of gray level masks allows the fabrication of "photoresist sculptures", which can, in principle, be used to fabricate almost any desired lens shape with excellent precession.

Thermal reflow techniques have been used to generate extremely uniform arrays of microlenses with arbitrary footprint shapes. The lenses are lithographically defined, and hence the size, shape, and pitch of the lens arrays can be controlled to within 0.1 um. However there are several drawbacks to this technique. First, it requires extensive characterization of the reflow process, including careful control of resist thickness, and exposure times, and the temperature, and heating times at which the reflow process is conducted. Second, since photoresist is opaque at many wavelengths of interest, it is often necessary to transfer the lens pattern to an underlying substrate, using an RIE. This again requires careful characterization. Because of the complications involved in characterizing the reflow process and the subsequent RIE, the technique is somewhat costly. See for example, Kufner, Maria and Stefan, Micro-optics and Lithography, VUBPRESSS, Brussels, 1997, pp 81-118, 183-184. See also Herzig, Hans Peter, Micro-Optics Elements, Systems and Applications, Taylor & Francis Ltd, Bristol, Pa., 1997, pp. 127-152. See also Sinzinger, Stefan, and Jahns, Jurgen, Microoptics, Weinheim, N.Y., 1999, pp. 85-123.

Finally, in the photothermal expansion technique certain materials (glasses, polymers), experience a local volume change when exposed to certain kinds of high intensity radiation. UV x-ray, electron, and proton beams have all been used to induce local volume changes in various materials, with the result that the exposed material is "squeezed" into a quasi-spherical lens shape.

Photothermal expansion techniques require particular photosensitive materials, and a high-energy radiation source, both of which impose cost and materials constraints. There also are limitations on the shape that the lenses can assume, and a post-exposure polish is often needed to ensure optical quality of the lenses. See for example, Kufner, Maria and Stefan, Micro-optics and Lithography, VUBPRESSS, Brussels, 1997., pp 81-118, 183-184. See also Herzig, Hans Peter, Micro-Optics Elements, Systems and Applications, Taylor & Francis Ltd, Bristol, Pa., 1997, pp127-152. See also Sinzinger, Stefan, and Jahns, Jurgen, Microoptics, Weinheim, New York, 1999, pp. 85-123.

2.1.2 Fabrication of Arrays of Microlenses by Hydrophobic Processes

Several authors have proposed and demonstrated techniques which enable the fabrication of microlens arrays by use of the hydrophobic effect. See M. E. Motamedi, et al., supra; P. Nussbaum, et al., supra; and also E. Kim and G. M. Whitesides, "Use of Minimal Free Energy and Self-Assembly To Form Shapes", Chem. Mater. 7, 1257-1264 (1995).

The present invention will be seen to be a modification of these previous techniques in that, inter alia, microlenses will be assembled by use of hydrophilic domains patterned in an adhesive (rather than a chemically-bonded) hydrophobic layer. Polymer microlenses in accordance with the present invention will be seen to be readily fabricated on a useful variety of substrates, including glass ($SiO_2$), Si, SiN, GaAs, InGaAs, and InP. See D. M. Hartmann, O. Kibar, S. C. Esener, "Characterization of a Polymer Microlens Fabricated Using the Hydrophobic Effect", Optics Letters 25, 975-977 (2000).

The present invention will also be seen to be different from the suggested processes of these papers because, inter alia, it has been recognized that the focal length of the microlenses can be controlled by adjusting any of a number of parameters during the fabrication process. These parameters include the substrate tilt angle and withdrawal speed (if the lenses are formed by a process of withdrawing the substrate from a liquid bath), the liquid viscosity, surface tension, density, and index of refraction, the fill factor of lens arrays, and the surface-free-energy of the hydrophilic and hydrophobic regions of the substrate.

The present invention will still further be seen to be different from the suggested processes of these papers because it allows strong (low f-number) lenses to be fabricated via multiple dip-coats, or multiple rounds of condensation.

The present invention will yet still further be seen to be different from the suggested processes of these papers because, inter alia, it may employ a unique self-alignment strategy, as immediately next discussed.

2.2 Aligning Microlenses to Optical Components, and Direct Fabrication of Microlenses on Optical Components There is a further present requirement to position microlenses in alignment to optical components. In particular, as optical systems have become more widespread increasing interest has arisen in the placement, or fabrication, of microlenses on or in precise spatial relationship to optically active devices such as vertical cavity surface emitting lasers (VCSELs), light emitting diodes (LEDs), and detectors, as well as directly upon passive components such as optical fibers. Such microlenses are used in coupling or guiding light from one optical component to another within an optical system.

Techniques for fabricating microlenses on or in fixed spatial relationship to other optical components naturally fall into two different categories: those in which the microlens is fabricated directly on the optical component, and those in which the microlens is fabricated externally, and is then aligned to the component of interest. Direct fabrication of microlenses has the advantage that the optical components themselves often define the footprints of the fabricated microlenses. For example, resist-reflow, ink-jet printing, and deep-proton irradiation have all been used to fabricate microlenses directly over the apertures of LEDs, VCSELs, and optical fibers using the apertures to define the microlens diameters. See, for example, P. Heremans, J. Genoe, and M. Kuijk, IEEE Photonics Tech. Letters 9, 1367 (1997); E. Park, et al., IEEE Photonics Technology Letters 11, 439 (1999); and M. Kufner, Microsystem Technologies 2, 114 (1996).

Similarly, microlenses have been fabricated on the ends of optical fibers by wet etching, laser ablating, or melting the ends of the fibers to produce microlenses. See, for example, Johnson et al., Proceedings of the SPIE 3740, 432 (1999); and Presby et al., Applied Optics 29, 2692 (1990).

Such microlenses can greatly improve the coupling efficiency of transmitters and detectors to optical fibers, and can even enhance the quantum efficiency of light-emitting devices. See, for example, P. Heremans, et al., supra; and also E. Park, et al., supra.

Direct fabrication of microlenses is useful when small optical beam diameters are acceptable. However free-space optical communication systems, optical switching systems, and many display and imaging applications, require relatively large beam diameters so that the beams do not appreciably diffract as they propagate through the system. In such cases, microlenses must be fabricated externally, some distance away from the output apertures of the optical components. This in turn requires careful alignment of the microlenses. Methods of performing such alignments include the use of precision grooves. See, for example, M. Rode and B. Hillerich, IEEE J. of Microelectromechanical Systems 8, 58 (1999).

Methods of performing such alignments also include micro-optical benches. See, for example, Y. Aoki et al., Applied Optics 38, 963 (1999); and also Y. Peter, Proc. of the SPIE 3513, 202 (1998).

Finally, methods of performing such alignments also include active-alignment using four-f imaging systems. The former schemes are somewhat limited in that they require the optical components to be placed into pre-fabricated structures, that have themselves been carefully aligned. The later active scheme, while more versatile, requires expensive machinery and can be extremely time consuming. When low f# microlenses are desired, alignment tolerances become so tight that the fabrication of microlenses aligned to optical components via any of these techniques becomes economically impractical. This limits the f# of microlenses that can be integrated and imposes minimum size constraints on the optical systems in which the microlenses are incorporated.

The first part of the present invention will be seen to show a new method for the low cost precision fabrication of microlenses. The second part of the present invention will show how, in an adaptation and extension of the base process, microlenses may be fabricated on, and in precision spatial relationship to, optical components.

2.3 Fabrication of Aligned Bump-bonds

Bump bonds, such as are commonly made with metal solders or with conductive polymer, must be aligned to the metal contact pads upon a substrate that commonly also contains electrical circuitry. The present invention will be seen to show how bump bonds may be fabricated in self-alignment to metal contact pads.

Solder bump bonding is by far and away the most widely used means of performing flip chip bonding. In the standard technique for placing solder bumps, a layer of solder (10 um thick or more) is thermally evaporated onto the chip, and lithographically patterned on top of wettable "base-metal" bonding pads. These bonding pads are surrounded by a non-wettable dielectric passivation layer, known as a solder dam. After lithographically patterning the solder, the substrate is heated to reflow the solder so that it forms a spherical bump, whose footprint is defined by the wettable base-metal pad area. A less-standard, but still widely used method of depositing the solder bumps is to electroplate them onto the base-metal bonding pads. There has even been some work conducted in ink-jet printing solder bumps on a circuit.

Polymer bump-bonds have also been explored for use in circuits, and have several important advantages over more conventional solder-bump bonds. These include a small size and weight, a reduction of processing costs, low-temperature curing capabilities, and the ability to easily rework flip-chip devices bumped with conductive adhesives.

Currently, there are several existing methods for fabricating polymer bump bonds. These include the use of stencils, screen-prints, and micromachining, to transfer a pattern of conductive polymer paste onto a substrate. Stencils and screens require careful alignment with the underlying bonding pads on the chip. The paste is then injected through the screen onto the bonding pads. Micromachined polymer molds have also been used to generate arrays of polymer bump bonds. The resulting polymer bonds must then be aligned to their bonding pads.

Like solder bump bonding, the present invention utilizes a wettable base-metal, surrounded by a non-wettable passivation layer to define the footprint of the polymer bumps. Uniquely, however, the liquid is self-assembled on the wettable base-metal, and there is therefore no need for any lithographic steps, reflow, or electroplating.

2.4 Fabrication of Bonds Between Perpendicular Substrates, and Other Three-Dimensional Microstructures It is difficult to fabricated electrical bonds between very small features at the edge regions of perpendicular substrates because it is difficult to hold the substrates in precise alignment while the features are connected, such as by soldering of corresponding solder pads upon two perpendicular substrates.

Still other three-dimensional microstructures, such as optical fibers or light pipes, might usefully serve to connect corresponding regions upon different substrates that occupy different physical spaces, including perpendicularly proximate to one another.

The present invention will be seen to show the generation of connections and features, both electrical and optical, both (i) in situ, and (ii) self-aligned, between corresponding small, micro, domains located on different physical bodies, including substrates and boards including as may be in a perpendicular relationship.

2.5 Summary Attributes of the Prior Art

Accordingly, it is known to assemble, at least, microlenses by placement of liquids onto hydrophilic domains within a hydrophobic background; no particular method of liquid transfer being, however, described. It is in particular known to deposit liquids on hydrophobic areas to form microlenses. See, for example, Use of Minimal Free Energy and Self-Assembly to Form Shapes, Enoch Kim and George M. Whitesides, Chem. Mater., 1995, 7, Pgs. 1257-1264. See also Microcontact Printing of Self-Assembled Monolayers: Applications in Microfabrication, James L. Wilbur, Amit Kumar, Hans A. Biebuyck, Enoch Kim, and George M. Whitesides, Nanotechnology 7m 1996, Pgs. 452-457.

It is also known to cure these liquids to form stable polymer structures by ultraviolet (UV) light curing, by thermal curing, and by other means. See, for example, Kim and Whitesides, id.

The formation of microlenses by (i) pulling a substrate through a polymer/$H_2O$ interface has in particular been described. See, for example, Self-Organization of Organic Liquids on Patterned Self-Assembled Monolayers of Alkanethiolates on Gold, Hans A. Biebuyck and George M. Whitesides, Langmuir 1994, 10, Pgs. 2790-2793. See also Kim and Whitesides, id.

Microlenses have also been formed by (ii) putting a drop of polymer on the substrate and then tilting the substrate. See, for example, Combining Patterned Self-Assembled Monolayers of Alkanethiolates on Gold with Anisotropic Etching of Silicon to Generate Controlled Surface Morphologies, Enoch Kim, Amit Kumar, and George M. Whitesides, J. Electrochem. Soc., Vol. 142, No. 2, February, 1995 Pgs. 629-633

Microlenses have still further been formed by (iii) first condensing water on the substrate and then depositing the polymer subsequently, so that the polymer goes only to the non-hydrophilic areas of the substrate. See, for example, Thin Microstructured Polymer Films by Surface-Directed film formation, H.-G. Braun, E. Meyer, appearing in Thin Solid Films 345 (1999) Pgs. 222-228.

The present invention will be seen to use a process step other than (i) passing through a polymer/$H_2O$ interface; or (ii) tilting; or (iii) condensing water/depositing polymer.

Quite logically, the prior art recognizes the use of microlens arrays to focus and correct aberrations in the intensity of light from lasers or optical fibers. See, for example, Biebuyck and Whitesides, id. However, the location and alignment of the arrayed microlenses relative to the light sources—as will be taught by the present invention—is problematic.

Finally, it is also known in the prior art to use conductive polymers for electrical connection, and to assemble the conductive materials (the conductive polymers) by dip-coating on hydrophilic domains. See, for example, Selective Deposition of Films of Polypyrrole, Polyaniline and Nickel on Hydrophobic/Hydrophilic Patterned Surfaces and Applications, Z. Huang, P. C. Wang, J. Feng, and A. G. MadDiarmid, Synthetic Metals 85 (1997) Pgs. 1375-1376.

However, to the best knowledge of the inventors, the prior art deals exclusively with the use of conductive polymer to make electrical contacts (that is, pads to which bump bonds may be attached). The present invention will shortly be seen to contemplate another use: the making of the bump bonds themselves.

SUMMARY OF THE INVENTION

The present invention contemplates the fabrication of precision microstructures on a base—such as a planar substrate or the butt end of an optical fiber—by (i) depositing a liquid material on hydrophilic domains of a base of patterned wettability, followed by (ii) using the material left upon the hydrophilic domains, including as is most often solidified, as a microstructure.

The liquid is strongly preferably a liquid polymer precursor, or monomer. In this case the liquid is solidified, or cured, after deposition to form a solid microstructure. However, the liquid—such as Glycerol—may remain a liquid, in which case the fabricated microstructure—normally a microlens or bump bond or bond as hereinafter discussed,—remains liquid, ergo a liquid microlens or liquid "bump" bond or liquid bond.

The depositing strongly preferably occurs by action of withdrawing the base from a bath of the liquid but may, equivalently, arise by condensing the liquid on the patterned hydrophilic domains.

The microstructures so fabricated preferably include (i) transparent solid polymer microlenses including as may be either arrayed or (in another aspect of the invention) self-aligned to optical fibers, (ii) conductive bump bonds self-aligned (in another aspect of the invention) to bump pads, and (iii) bonds between corresponding small domains on separate substrates, including as are most commonly mutually perpendicular.

The present invention further contemplates self-alignment: an adaptation of the fabrication process to produce microstructures that are self-aligned to other micro-sized features, most commonly patterned domains on a substrate, fiber or other physical body. For example, microlenses may be self-aligned at time of their fabrication to optical fibers and low-wavelength broad-band and/or single-mode light sources. For example, bump bonds may be self-aligned at time of their fabrication to bump pads present upon a substrate.

This self-alignment is very useful: optically connective (e.g. microlenses) or electrically connective (e.g., bump bonds) microstructures end up on substrates, optical fiber ends, or wherever in exactly the desired locations. Consider, for example, the self-alignment of bump bonds. The deposition of conductive polymers on metal contact pads contemplated by the present invention permits, by virtue of the fact that these metal contact pads are hydrophilic, the in-situ fabrication of conductive bump bonds that are precisely and perfectly aligned to metal contact pads—a non-trivial accomplishment when the pads and bonds are small.

The present invention still further contemplates the fabrication of bonds between metal contact pads on perpendicular substrates. Such bonds are achieved through (i) the deposition of conductive polymers on the contact pads of both substrates and (ii) the subsequent alignment of the substrates perpendicular to one another—in a motherboard/daughterboard fashion—such that the conductive polymers on the two substrates contact one another in precise spatial locations, thereby establishing electrical connections between the two substrates at those locations. Heretofore this and other three-dimensional optical and electrical interconnections contemplated by the present invention were difficult or impossible of practical realization.

1. Fabrication of Polymer Microstructures by Hydrophobic Effect

The microstructures fabricated by the method of the present invention may be, for example, microlenses. In that case (i) a liquid polymer precursor is deposited on the hydrophilic domains of a substrate of patterned wettability by action of, preferably, withdrawing the substrate from a bath of the liquid polymer precursor, followed by (ii) curing the liquid polymer precursor left upon hydrophilic domains into transparent solid polymer microlenses by heat, ultraviolet light, chemicals or other conventional means.

Significantly, the most preferred fabrication method realizes the (i) depositing by dip coating. Moreover, the most preferred hydrophobic layer is adhesive, rather than chemical.

Next, the present invention further contemplates that when and if the substrate is withdrawn from a liquid bath of polymer precursor—as is preferred—to produce microlenses then the f-number (f#) of the microlenses so fabricated is precisely controllable by adjusting any of (i) liquid viscosity, surface tension, density, index of refraction and like physiochemical properties; (ii) surface-free-energies of the hydrophilic and hydrophobic regions of the substrate; (iii) substrate dipping angle; (iv) substrate withdrawal speed; (v) array fill factor; and/or (vi) number of dip coats used.

Being that, to the best knowledge of the inventors, they are the first to employ dip-coating in a hydrophobic process for the production of microstructures including microlenses, they are the first to recognize that control of the substrate withdrawal speed, and dipping angle, monomer viscosity, surface tension, density, and index of refraction, and the array fill-factor, and the surface-free-energies of the hydrophilic and hydrophobic areas will permit control of the f# of microlenses. Indeed, the same substrate can be withdrawn slowly at one time and quickly at another so as to create microlenses of dramatically different f# immediately adjacent to each other.

Moreover, the invention still further contemplates that multiple dip-coats can be used to improve lens performance; a "faster" lens with a lower f# resulting from multiple dipping/curing cycles. Clearly if only a portion of a substrate is re-dipped than only the microlenses of that portion will augmented.

The microlenses so precision fabricated are useful. They can be fabricated with a range of f#s (with a plano-convex minimum of f/1.38), excellent surface profiles (maximum deviation from a sphere was <±5 nm over the center 130 µm of 500 µm diameter f/3.2 microlenses), and are stable at room temperature.

Fabrication of the microlenses is well controlled, and the microlenses so fabricated are of uniform high quality. An optimum withdrawal speed was identified at which (i) the f# of each microlens was minimized while (ii) uniformity of all microlens in the array was maximized. At this optimum speed arrays of f/3.48 microlenses were fabricated using one dip-coat with uniformity better than $\Delta f/f \sim \pm 3.8\%$. Multiple dip-coats allowed production of f/1.38 microlens arrays and uniformity better than $\Delta f/f \sim \pm 5.9\%$. Average f#s were reproducible to within 3.5%.

Although inventors are not charged to know the theory of their invention, a model of the process of the present invention has been developed. This model, describing the fluid transfer process by which liquid solution assembles on the hydrophilic domains, accurately describes real-world results. By use of the model microlenses of any reasonably desired properties may be fabricated, including with massive parallelism.

2. A Method of Fabricating Polymer Microlenses

Accordingly, in one of its aspects the present invention is embodied in a method of fabricating polymer microlenses.

The method consists of depositing liquid on the hydrophilic domains of a substrate of patterned wettability. Liquid transfer may be achieved by withdrawing the substrate from a liquid bath (dip-coating the substrate), or by condensing the liquid. In either case, the liquid collects in hydrophilic areas of the substrate and forms caps of the liquid which may then be (optionally) cured so as to form solid microlenses.

By adjusting at least one of (i) liquid viscosity, surface tension, density, and index of refraction (ii) the surface-free-energies of the hydrophobic and hydrophilic areas of the substrate, (iii) the angle of the substrate withdrawal, (iv) the speed of the withdrawing of the substrate, (v) the proximity of hydrophilic areas one to the next, and/or (vi) the number of times the dip-coating or condensation is performed, the process may be controlled to allow the f-number (f#) of the resulting microlenses to be predictably and repeatably controlled. The process is preferably controlled in all these parameters, which may be varied during the fabrication of multiple microlenses upon a single substrate so as to vary the properties, most notably the f#, of the microlenses.

3. A Detailed Method of Fabricating Polymer Microlenses

In greater detail, in the method of the present invention for fabricating polymer microlenses a hydrophobic layer is first applied to a substrate. This hydrophobic layer can be, and preferably is, adhesive in nature, in which case it can be applied by mechanically polishing the substrate with the hydrophobic material or by spinning the hydrophobic layer onto the substrate. More conventionally, this hydrophobic layer can also be chemical in nature, in which case it can be applied by micro-contact printing (as taught by Whitesides, et al., id.), or by surface modification in a chemical bath. The substrate may be any material that can be appropriately chemically modified, or to which the hydrophobic layer will adhere. Substrates on which deposition of a hydrophobic layer, and subsequent fabrication of microlenses (by method of the present invention), have been demonstrated include glass, Si, SiO2, SiN, GaAs, InGaAs, or InP. Other substrates may also be suitable.

The hydrophobic layer is patterned, so as to produce a plurality of hydrophobic, and hydrophilic, areas. The layer is patterned with a desired level of accuracy (typically lithographic accuracy). If the hydrophobic layer is applied to the full substrate, it can be patterned by standard lithography. Alternatively, micro-contact printing (see Whitesides, et al., id.) or similar techniques can be used to deposit pre-formed patterns of hydrophobic material with lithographic accuracy. Finally, if the hydrophobic layer is applied to a substrate consisting of two or more materials, and the hydrophobic layer is properly chosen so that it adheres or bonds to all but one of the materials, then the hydrophobic layer is patterned by virtue of the underlying material heterogeneity. The accuracy of the hydrophobic patterning then depends on the accuracy with which the heterogeneous substrate was originally fabricated.

Liquid is next allowed to assemble on the substrate with its selectively patterned hydrophobic layer. Liquid may be transferred to the substrate by one of two means. First, liquid may be condensed onto the hydrophilic areas of the substrate. Second, and preferably, the substrate may be dipped into a liquid bath and then controllably withdrawn from the solution so that, as the substrate is withdrawn, the liquid drains from the hydrophobic areas of the substrate but remains on the hydrophilic areas. For the fabrication of homogeneous structures the parameters, including the speed, of the withdrawal remain constant. However, if different properties are desired in the polymer structures that will be created in different regions of the substrate then the parameters of the withdrawal, most notably including the speed of withdrawal, can be varied. The dip-coating method is preferred because of the excellent, and wide-ranging, control over the liquid-deposition process that it affords.

Regardless of which method is used to transfer liquid to the substrate, the liquid clings to the hydrophilic areas, and forms caps of liquid under the influence of surface tension. These caps will adopt a shape that minimizes their free energy.

The caps may be used as lenses in their liquid form. Such liquid lenses have potential for use as variable focusing lenses. Alternatively if the liquid that comprises the lenses is a curable-solution, (e.g. a monomer solution), then the caps of curable monomer present upon the substrate may be cured so as to make one or a plurality of solid polymer microlenses. The liquid monomer may be cured by ultraviolet (UV) light or other optical curing methods. The liquid monomer may alternatively be curable by evaporation of a solvent, or by heat or time-induced changes in chemical structure of the monomer.

The lithographic patterning of the hydrophobic layer into a plurality of regularly geometrically sized and related areas can be conducted so that the plurality of microlenses ultimately formed by the curing are in a regular array. A great number of microlenses may be fabricated with massive parallelism.

Importantly, this base method may be extended to (i) re-dipping the substrate with its plurality of polymer microlenses into the liquid monomer solution so that additional monomer solution accrues on top of the existing cured microlenses (ii) re-withdrawing the substrate from the solution, and, (iii) re-curing the newly-added curable monomer present upon the plurality of microlenses (which are upon the substrate) so as to make an augmented microlenses having a decrease in the radii of curvature, and a corresponding reduction in f#. By repetitively re-dipping, re-withdrawing and re-curing, microlenses of any (reasonably) desired low f# may be produced. Similarly, instead of re-dip-coating the substrate, additional rounds of liquid condensation and curing may be performed. However, dipping is particularly easily manipulated to produce different microlenses—particularly as comprise different materials, or as have different f#'s—in different regions of the same substrate. This is realized simply by selectively dipping and re-dipping certain regions, optionally into selective solutions. For example, microlenses of different colors can be created on the same substrate.

4. Fabrication of Self-aligned Microlenses

An important adaptation and extension of the base method of the present invention for fabricating microlenses permits the production of microlenses that are self-aligned to optical fibers and/or low-wavelength single-mode optical transmitters. The adapted and extended method can be used to self-align microlenses directly on the optical components or, further uniquely, on transparent spacers that serve to separate the microlenses from the components.

Because the microlenses are self-aligned, low f# microlenses that would otherwise require tight alignment tolerances can be integrated with ease. As an example, f/1.55 microlenses with smooth surface profiles, deviating from spherical by just ±15 nm, have been integrated on SMF optical fiber. Arrays of such microlenses having excellent uniformity ($\Delta f/f \sim 5.9\%$ for a 15×15 array of 500 µm f/1.4 microlenses), stability, and reproducibility (average f#s are reproducible to within 3.5%) can be fabricated with massive parallelism.

4.1 Detail Method of Fabricating a Microlens Precision Sized, Aligned and Spatially Positioned to a Small Light Source In detail, the method of the present invention for fabricating a microlens that is precisely (i) sized, (ii) aligned and (iii) spatially positioned to a small light source proceeds as follows:

A small light source—such as a vertical cavity surface emitting laser (VCSEL), light emitting diode (LED), or a passive component such as an optical fiber that is coupled to some light source so as to emit light at one end—is affixed—by transparent adhesive or other means—to a transparent "spacer element" having a surface on which is present a hydrophobic layer and a photoresist layer. The light output of the small light source is directed onto this surface of the transparent "spacer element". (The "spacer element" is so called because, ultimately, it will serve to space the small light source from a microlens that is yet to be created.)

Next, the surface of the spacer element is patterned. This occurs by (i) exposing the photoresist with, only at the light output of, the small light source, then (ii) etching away the hydrophobic layer at and from the exposed region (such as with $O_2$ plasma), and then (iii) stripping remaining photoresist so as to leave a hydrophilic domain in a hydrophobic background sized, shaped and juxtaposed relative to the light output of the light source.

Next, a microlens is formed upon the patterned surface of the spacer element. This occurs by transferring liquid to the hydrophilic domain by condensing liquid on the domain, or by (i) immersing the surface-patterned spacer element in an (optionally curable) liquid solution, then (ii) withdrawing the spacer element from solution so as to leave in the hydrophilic area of its patterned surface a liquid cap, followed by (iii) optionally curing the liquid cap to form a solid microlens. As with the base method of the present invention, the (i) immersing and the (ii) withdrawing and the (iii) curing may be repeated so as to form a microlens of any (reasonably) desired low f#. Similarly, successive rounds of condensation and curing may be used repeatedly so as to form a microlens of any (reasonably) desired low f#.

By these steps, a microlens is created upon the surface of the spacer element in a position juxtaposed to the light source, and in a shape and a size of the light output from the light source. The precision microlens so created is useful to guide light emitted from the light source (which light is first received into the affixed transparent spacer element).

The transparent spacer element is most commonly a rectilinear substrate (such as a glass slide), and a great number of microlenses as serve to couple the light outputs of a corresponding great number of light sources (such as VCSELs upon the substrate of a hybrid optoelectronic circuit) can be fabricated all at the same time, and in parallel.

The intensity and/or the duration, and preferably both the intensity and the duration, of the light output of each small light source is controlled so as to control the size of an area of the photoresist that is exposed, and subsequently etched. Note that not all light sources, even if of the same type, have to be equally illuminated (so as to cause equal-size areas of exposed photoresist and, ultimately and other parameters remaining constant, equally-sized microlenses). Note that an area may be illuminated where a microlens will never be made, and where no optical coupling will ever ensue; the area being instead used for a conductive polymer electrical connection bump pad. It is clear the present invention accords flexibility in fabrication of polymer microstructures—even as transpires upon the same substrate at the same time, or during related steps at sequential times.

The area of the microlens ultimately formed on the surface of the spacer element is thus controllable. Note also that the light output from the light source, especially as appears at the end of an optical fiber may be, and commonly is, controlled to be more intense and/or more persisting than will be another beam, normally for communications purposes, employed during a future usage of the fiber in an optical system; the more intense and/or more persistent photoresist exposure beam making the ultimately resulting lens to be desirably "oversize" for and in its actual system usage (i.e., so that the actual system's light beam under-fills the lens).

4.2 Detail Method of Fabricating a Microlens Directly Upon the End of an Optical Fiber In detail, the method of the present invention for fabricating a microlens upon the butt end of an optical fiber proceeds as follows:

The butt end of an optical fiber is coated first with a hydrophobic material and then with a photoresist.

Hydrophobic material is then patterned upon the coated optical fiber end by (i) exposing the photoresist with light output from the optical fiber source, then (ii) etching away the hydrophobic material at and from the exposed region, and then (iii) stripping remaining photoresist so as to leave a hydrophilic domain sized and shaped relative to the light output of the optical fiber.

Finally, a microlens is formed upon the patterned optical fiber end. This transpires by either condensing liquid on the hydrophilic domain or by (i) immersing the patterned optical fiber end in an (optionally curable) liquid, then (ii) withdrawing the optical fiber end from the liquid so as to leave in the hydrophilic area of the optical fiber end a liquid cap, and then (iii) optionally curing the liquid cap to form a solid microlens.

As with the base method of the present invention, the (i) immersing and the (ii) withdrawing and the (iii) curing may be repeated so as to form a microlens of any (reasonably) desired low f#. Similarly, successive rounds of condensation and curing may be used repeatedly so as to form a microlens of any (reasonably) desired low f#.

By these steps a microlens is located upon the optical fiber end in a shape, and in a size of, light that is output from the optical fiber. This precision microlens is useful to guide this light output from the optical fiber. The method may be performed in parallel on a great number of optical fibers.

5. A Method of Fabricating Conductive Polymer Bump Bonds

The present invention further contemplates utilizing the same fundamental technology to produce conductive polymer bump bonds that are self-aligned to underlying metal contact pads.

5.1 Detail Method of Fabricating Conductive Bump Bonds Self-aligned to Contact Pads In yet another of its aspects the present invention is embodied in a method of fabricating conductive bump bonds self-aligned to contact pads.

The fabrication of bump bonds occurs by applying a hydrophobic layer to a heterogeneous substrate (consisting of two or more materials) such that at least one material on the substrate remains hydrophilic, followed by the transfer of liquid to the hydrophilic areas of the substrate through condensation of the liquid on the hydrophilic domains or by immersing the substrate in an (optionally) curable liquid solution, and then withdrawing the substrate from the liquid so as to leave in the hydrophilic areas of the substrate caps of the liquid, that may be (optionally) cured to form a solid conductive bump bond, self-aligned to the hydrophilic domains on the heterogeneous substrate.

The present invention will be seen to facilitate the fabrication of bump bonds by a method similar to the method of microlens fabrication. Specifically, a heterogeneous substrate, consisting of contact pads of one material patterned within a background of a second material is used. A hydrophobic layer that preferentially adheres or chemically bonds to all parts of the substrate except the contact pads is then applied. Thus, the contact pads are left hydrophilic, while the remainder of the substrate is made hydrophobic. Liquid is then transferred onto the hydrophilic contact pads. The transfer of liquid may be achieved (1) by condensing the liquid onto these hydrophilic domains, or (2) by withdrawing the heterogeneous substrates of patterned wettability from the liquid solution, whereby liquid drains from the hydrophobic areas of the substrate and remains on the hydrophilic contact pads. Following liquid transfer, the liquids may be solidified by a process of curing or solvent-evaporation to produce bump bonds. These bump bonds may be conductive immediately upon curing, or may require post-curing treatment (such as with acid-treatment) to cause the bonds to become conductive. Because the hydrophilic areas of the substrate are the contact pads where the bump bonds are desired, the bump bonds are fully self-aligned to these contact pads.

6. A Method of Fabricating Conductive Polymer Bonds Between Mutually Perpendicular Substrates The present invention still further contemplates utilizing the same fundamental process of the invention to produce conductive polymer bonds that are self-aligned to underlying metal contact pads and which can be used to electrically connect mutually perpendicular substrates. It is normally sufficient to pattern a substrate, or board, which will be mounted edge-on only on its major surface (or surfaces). However, like as the patterning of the butt end of an optical fiber, the edge side of a board or substrate can be patterned, or additionally patterned, if desired or required (to make particularly exacting electrical and/or mechanical connections).

The fabrication of electrical contacts between substrates preferably occurs by (i) patterning a hydrophobic layer on each of two heterogeneous substrates such that at least one corresponding domain on each substrate remains hydrophilic. Then transpires, in either order, (iii) transferring a liquid conductive-polymer-precursor to the hydrophilic areas of both substrates, and (ii) bringing the substrates together so that one or more corresponding domains on each substrate are proximate. In other words, the liquid may be first applied to each substrate, and the substrates then brought together—as is preferred—or else the substrates may be brought proximate to each other and the liquid then applied to both in common.

Finally, transpires (iv) curing of the liquid conductive-polymer-precursor so as to bond the two substrates together with electrical connection between corresponding domains on each substrate. The actual physical attachment of the substrates is normally made by a frame, or by epoxy adhesive, but, depending upon numbers and size, the polymer bonds may provide physical, as well as electrical, attachment.

These and other aspects and attributes of the present invention will become increasingly clear upon reference to the following drawings and accompanying specification.

BRIEF DESCRIPTION OF THE DRAWINGS

Referring particularly to the drawings for the purpose of illustration only and not to limit the scope of the invention in any way, these illustrations follow:

FIG. 3 is a Table 1 listing the minimum f# and the speed at which the minimum f# is formed for several monomer solutions and a glycerol solution, particularly for 500 µm diameter microlenses with an array fill factor ~0.25.

FIGS. 8a and FIG. 8b are optical microscope pictures of the surface of a 50 µm diameter microlens of, respectively, ~f/3.5 made with one dip coat, and ~f/1.6 made with two dip coats.

FIGS. 8c and FIG. 8d are Atomic Force Microscope (AFM) pictures of, respectively, the microlenses of FIGS. 8a and 8b.

FIGS. 14a and 14b are diagrammatic representations of liquid assembling into bumpbonds on bump pads.

FIGS. 15a and 15b are diagrammatic representations of liquid assembling into bonds on, and between, perpendicular substrates.

DESCRIPTION OF THE PREFERRED EMBODIMENT

Figure 1A:
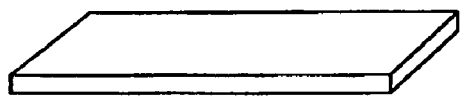
FIG. 1, consisting of FIGS. 1a through 1f, is a diagrammatic representation of the flow of the method of the present invention for the hydrophobic patterning of microlenses.
Figure 1B:
Figure 1C:
Figure 1D:
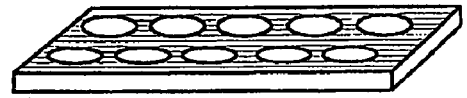
Figure 1E:
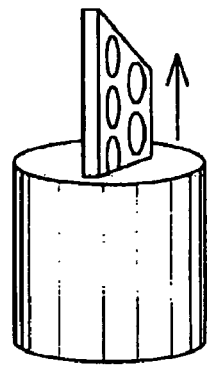
Figure 1F:

The following description is of the best mode presently contemplated for the carrying out of the invention. This description is made for the purpose of illustrating the general principles of the invention, and is not to be taken in a limiting sense. The scope of the invention is best determined by reference to the appended claims.

Although specific embodiments of the invention will now be described with reference to the drawings, it should be understood that such embodiments are by way of example only and are merely illustrative of but a small number of the many possible specific embodiments to which the principles of the invention may be applied. Various changes and modifications obvious to one skilled in the art to which the invention pertains are deemed to be within the spirit, scope and contemplation of the invention as further defined in the appended claims.

1. Fabrication of Microlens Arrays

In accordance with the present invention, large and uniform arrays of microlens of controlled optical properties may be reliably reproducibly fabricated.

Following section 1.1 describes the characterization and optimization of microlenses, and microlens arrays, fabricated by the method of the present invention. Arrays of microlenses with footprints 2-500 µm in diameter were fabricated by withdrawing substrates of patterned wettability from a monomer bath at a controlled speed. The fabricated arrays had lithographically-defined pitches, allowing fill-factors up to 90%. At low withdrawal speeds the average f# of formed microlenses could be reduced by increasing substrate withdrawal speed or monomer viscosity, or by decreasing monomer surface tension. At larger withdrawal speeds, the average f# was minimized and became constant, independent of withdrawal speed. This minimum achievable f# could be reduced by using a monomer with a large viscosity and large surface tension. At all withdrawal speeds, the f#s of formed microlenses could be reduced by decreasing the array fill factor or by tilting the substrate so that its patterned side was tilted up during the withdrawal process. Control of the withdrawal speed during fabrication permitted integration of microlenses having different f#s within the same array. The uniformity of microlens arrays was analyzed in terms of defect density and microlens-to-microlens variability. The number of conjoined microlenses could be minimized by reducing the array fill factor, monomer viscosity, and substrate withdrawal speed. In arrays with no defects, an optimum withdrawal speed was shown to exist at which array uniformity was maximized (i.e. the % change in the focal length across an array was minimized). At this optimum, arrays of f/3.48 microlenses were fabricated using one dip-coat with a uniformity better than $\Delta$f/f~±3.8%. Multiple dip-coats allowed production of arrays of f/1.38 microlenses with uniformity better than $\Delta$f/f~5.9%. Average f#s were reproducible to within 3.5%. These values are competitive with those of leading microlens fabrication technologies. Finally, other microlens characteristics, such as the diameter, shape, and surface roughness of the microlenses were shown to be excellent, and independent of the fluid transfer process.

Next following section 1.2 describes a model of the process of the method of the present invention. The model in particular describes the fluid transfer process by which monomer solution assembles on the hydrophilic domains, forming microlenses under the influence of surface tension. Specifically, equations which describe the fluid transfer process on homogeneous hydrophilic and hydrophobic substrates are given, and these equations are merged to give an approximate solution for fluid transfer onto a heterogeneously wettable substrate. Although the resulting equations are derived from the analysis of homogeneous substrates, and are therefore inexact for the heterogeneous case, they nonetheless provide insight into the forces governing the microlens-forming process.

Next following section 1.3 sets forth theoretical predictions of microlens characteristics which have been compared with actual results, with good agreement being found. The conditions that can be used to fabricate optimal microlens arrays are stated.

Finally, in the last following section 1.4 the results of the base method of the invention are summarized.

1.1 Fabrication and Characterization of Microlens Arrays

The preferred method of the present invention for the fabrication of microlens arrays is diagrammatically illustrated in FIG. 1, consisting of FIG. 1a through FIG. 1f.

An adhesive hydrophobic layer is mechanically applied to the substrate with a polishing cloth. The substrate is then lithographically patterned and the hydrophobic layer selectively etched away from the exposed regions. The substrate is then dipped into and withdrawn from a UV-curable-monomer solution at a controlled speed. As the substrate is withdrawn, the monomer solution drains from the hydrophobic areas of the substrate but remains on the hydrophilic domains. The remaining solution forms spherical caps under the influence of surface tension and can be UV-cured to form environmentally stable microlenses.

After curing, if stronger (lower f#) microlenses are desired, the substrate may be re-dipped into the monomer solution. Additional monomer solution assembles on top of the existing cured microlenses, causing an increase in the radii of curvature, and a corresponding reduction in f#. This process of curing and re-dipping the substrate may be used repeatedly to reduce the f# of the fabricated microlenses.

For consistency, glass microscope slides were used as substrates for all results reported in this specification. All monomer solutions used had a density of ~1.08 g/cm$^3$. Once UV-cured, all polymers had an index of refraction of approximately ~1.5.

After fabrication, the microlenses were characterized. Fifteen—twenty microlenses were selected across a row of the microlens array under test, and their focal lengths were measured. From these measurements, the average f# and the standard deviation of the focal length for the array were determined. The average f# was plotted as a function of the variable to be studied, and error bars were included representing one standard deviation from the average value. After completing one set of measurements, the substrate could be re-dipped into monomer solution, withdrawn at a new speed, and the same microlenses could then be measured.

For a given monomer solution, at low withdrawal speeds, increasing substrate withdrawal speed results in a decrease in the f# of formed microlenses. At these speeds, increasing monomer viscosity or decreasing monomer surface tension also results in lower f#s at any given withdrawal speed. These trends can be seen in FIG. 2, which shows average f# vs. withdrawal speed for an array of 500 µm-diameter microlenses for two monomer solutions and a glycerol solution. A Sartomer CD541 monomer solution has a high viscosity, µ, of ~440 centipoise (cP) and a low surface tension, σ, of ~35.3 dynes/cm, and gives rise to the smallest f#s at all withdrawal speeds shown in FIG. 2. A glycerol/H$_2$O solution, with a large viscosity (µ~450 cP) and a large surface tension (σ~64 dynes/cm) gives rise to slightly larger f#s. Finally, a Sartomer SR238 monomer solution has a low viscosity (µ~9 cP) and a low surface tension (σ~35.7 dynes/cm) and gives rise to very large f#s.

Figure 2:
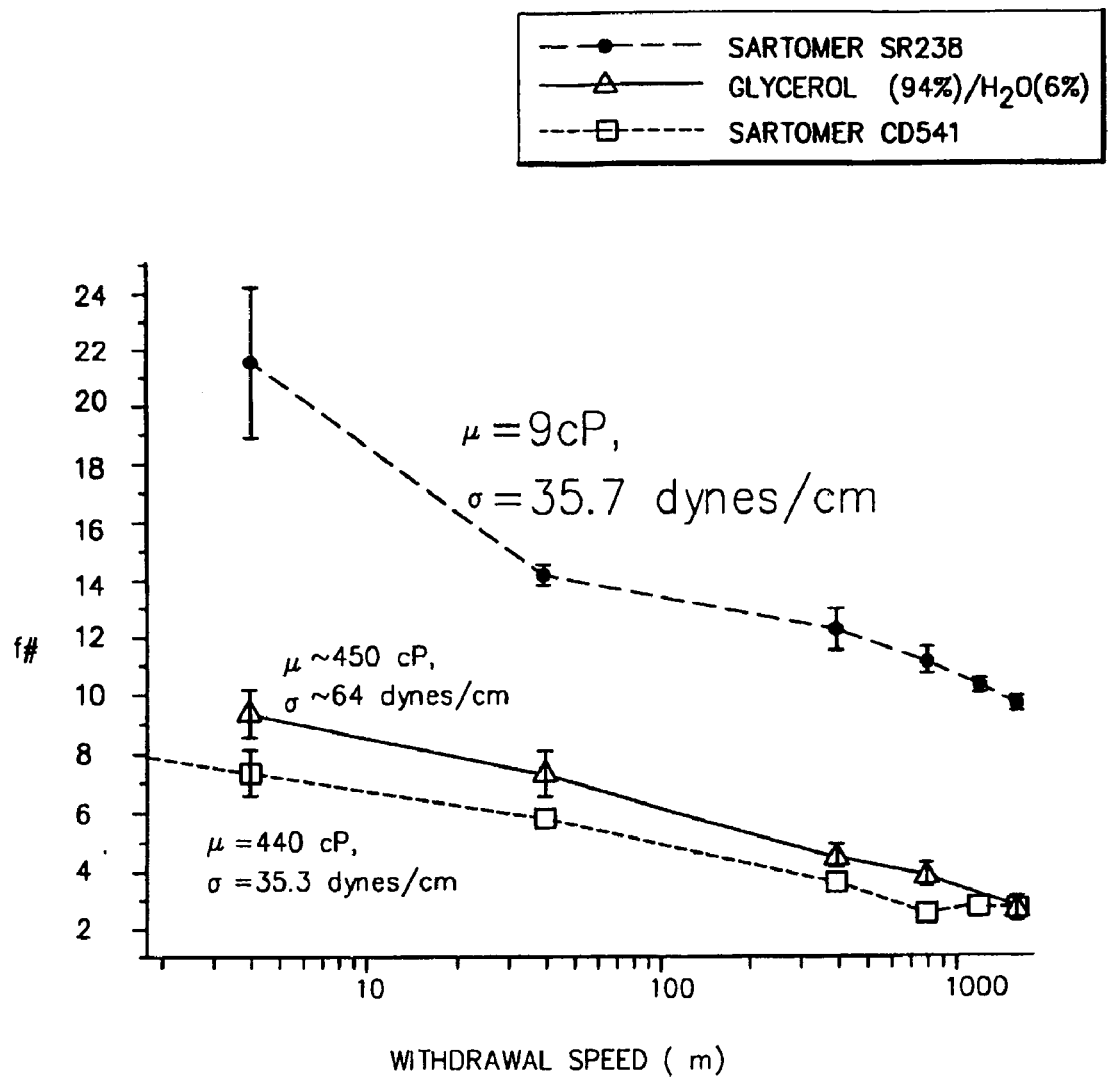
FIG. 2 is a graph of f# vs. substrate withdrawal speed for 500 μm-diameter microlenses (fill factor~0.24 ), for Sartomer CD541 and Sartomer SR238 monomer solutions, and a glycerol solution.

For a given monomer solution, as withdrawal speed is further increased, the f# reaches a minimum value after which it increases slightly and thereafter remains constant, independent of further increases in withdrawal speed. FIG. 2 shows this minimum (f/~2.5) for the Sartomer CD541 monomer solution occurring at a withdrawal speed of ~800 µm/s. Both the minimum value of the f# that can be achieved and the withdrawal speed at which it occurs are functions of the surface tension and viscosity. FIG. 3 is a Table 1 showing the minimum achievable f# and the speed at which it occurs for several monomer solutions and a glycerol/H$_2$O solution. It can be seen from the Table 1 that the smallest minimum f#s can be achieved for solutions with large viscosities and large surface tensions.

Figure 4:
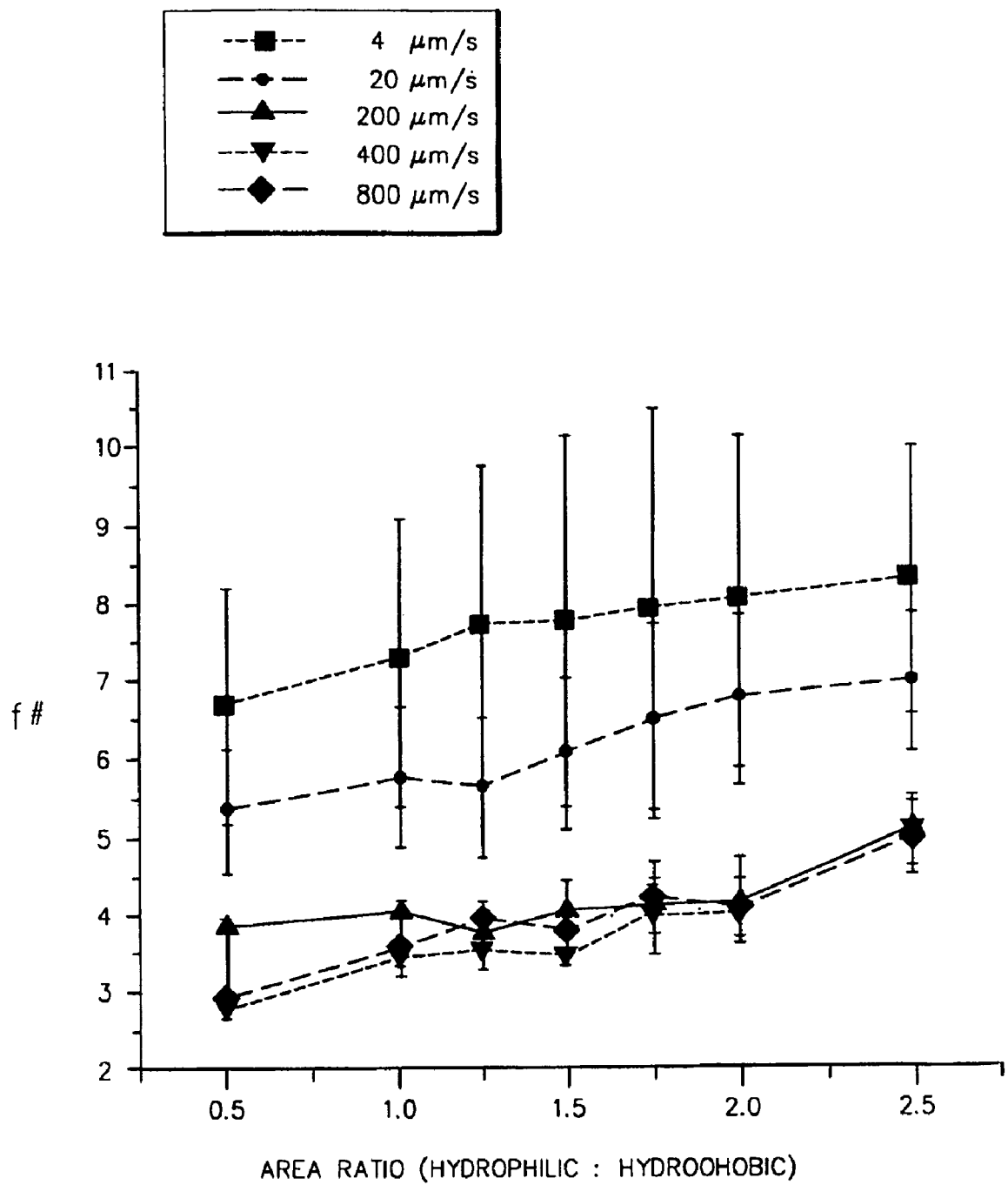
FIG. 4 is a graph of f# of 100 µm diameter microlenses made with Sartomer CD541 (µ~440 cP) monomer solution, vs. area ratio (hydrophilic area:hydrophobic area) for various withdrawal speeds.

For a given monomer solution, the average f# of the formed microlenses decreases as the fill-factor of the array decreases (i.e. as the ratio of hydrophilic:hydrophobic area decreases) Shown in FIG. 4 is a graph illustrating this trend for an array of 100 µm-diameter circular microlenses, fabricated from the Sartomer CD541 monomer solution at several different substrate withdrawal speeds.

Figure 5:
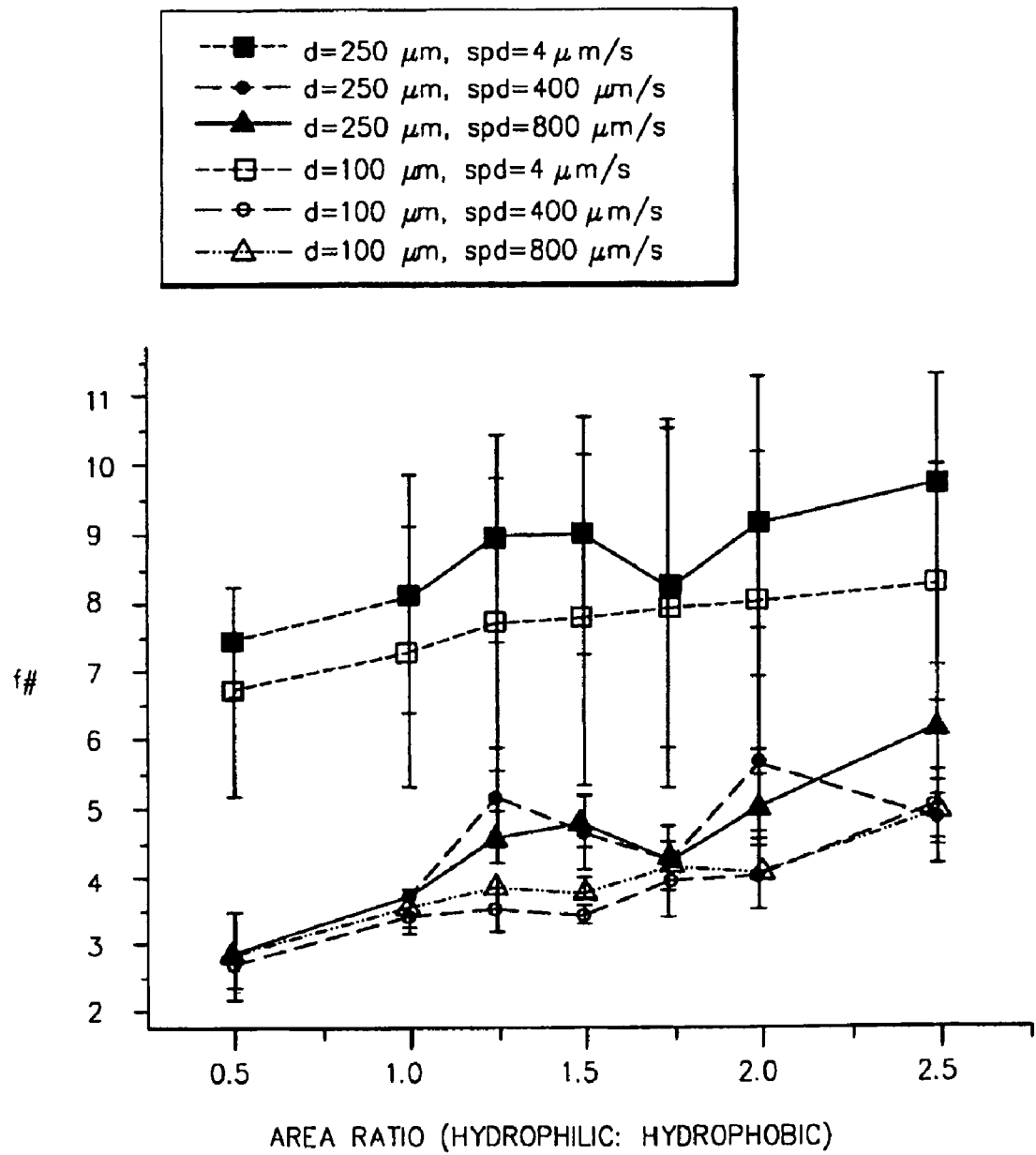
FIG. 5 is a graph of f# of 100 and 250 µm diameter microlenses made with Sartomer CD541 (µ~440 cP) monomer solution, vs. area ratio (hydrophilic area:hydrophobic area) for various withdrawal speeds.

The average f# of the formed microlenses also depends greatly on the shape of the domains. Because of the large number of possible geometric domain shapes, we have not attempted to quantify the differences between various microlens shapes (circular, square, elliptical, etc.). Rather, for consistency, we have used circular domains in characterizing the parameters that affect microlens formation. For circular domains, the domain diameter does not significantly influence the achievable microlens f# provided that the array fill factor is maintained constant (although there are minor differences at low withdrawal speeds). FIG. 5 illustrates this fact for 100 and 250 µm diameter microlenses, where the average f# at various withdrawal speeds is plotted as a function of the array fill factor.

The average f# of the formed microlenses is also dependent upon the angle with which the substrate is withdrawn from the monomer bath. If the substrate is withdrawn such that its patterned face is tilted up, the f# of formed microlenses is reduced. Conversely, if the patterned face is tilted down, the f# of formed microlenses is increased. For consistency, all substrates in the experiments we conducted were withdrawn from the monomer solution vertically (with 0 degrees tilt).

When all other conditions (i.e. substrate material, withdrawal angle, monomer solution, microlens shape and diameter, and array fill-factor) are held fixed, the f# of a fabricated microlens depends only upon the speed with which the substrate is withdrawn from the monomer solution. By varying the substrate withdrawal speed during the withdrawal process, different f#s can therefore by integrated in the same array in close proximity. This allows the implementation of a variety of optical architectures in which it is desired that different rows in an array of microlenses have the same diameters but different f#s.

In addition to the f# of the microlenses, the uniformity of microlenses within an array is a parameter of interest. Analysis of the uniformity of a microlens array requires consideration of both the number of defects (lenses which are joined together, missing, or misshapen) within the array, and an analysis of the uniformity of those microlenses that are not defective.

The number of conjoined microlenses within an array is a function of the fill factor of the array, the viscosity of the monomer solution, and the speed with which the substrate is withdrawn. At very large fill factors, no conjoined microlenses are produced even at high withdrawal speeds. As the fill factor is increased (higher density of microlenses), conjoined microlenses begin to appear at high withdrawal speeds. If conjoined microlenses are produced at a given fill factor, then for a given withdrawal speed, more viscous monomers result in more of these defects than low viscosity monomers. Misshapen or missing microlenses also occur. These defects can be minimized by using a monomer with a surface tension that is small enough that the monomer fully wets the hydrophilic areas of the substrate.

Figure 6:
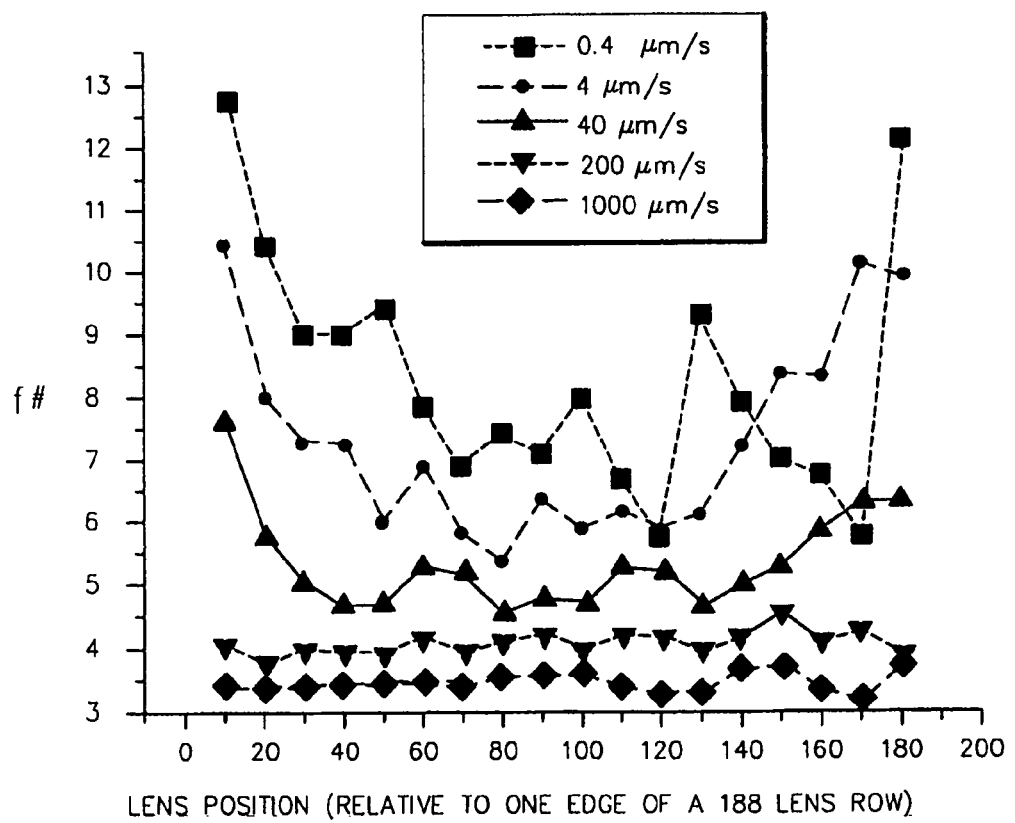
FIG. 6 is a graph of f# for 50 µm-diameter microlenses versus the position of the microlens in a row of 188 microlenses, as measured from one of the edges of the row.
Figure 7:
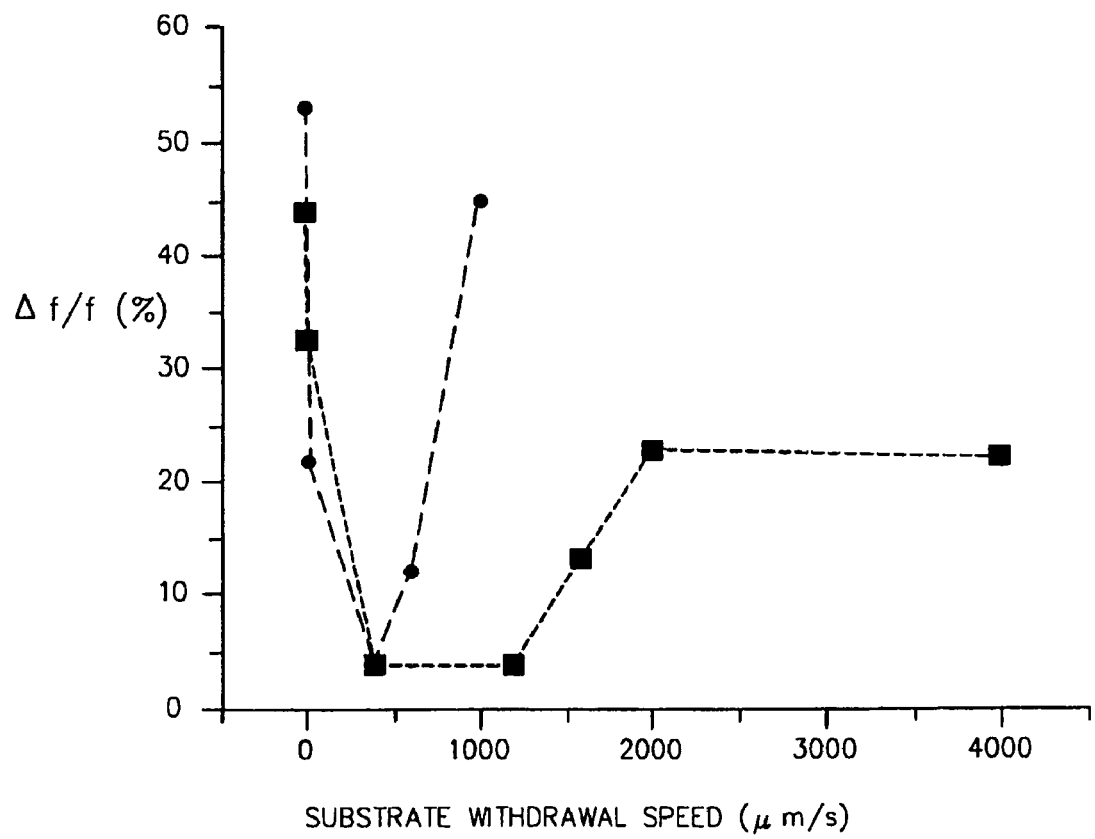
FIG. 7 is a graph of $\Delta$f/f vs. substrate withdrawal speed for 500 µm diameter microlenses (fill factor~0.25), made with Ciba 5180 (µ~200 cP), and Sartomer CD541 (µ~440 cP) monomer solutions.

Even arrays fabricated with no defects exhibit non-uniformities. These non-uniformities are in the form of microlens-to-microlens variations in focal length, and are a function of the substrate withdrawal speed. At slow withdrawal speeds, the f#s of the microlenses at the left and right edges (but not the top and bottom edges) of an array of microlenses are increased well above the average f# of microlenses in the array. (Here, left, right, top, and bottom are defined in relation to how the array is withdrawn from the monomer solution. The "top" edge of the microlens array is the edge that is "uncovered" first as the substrate is withdrawn). These edge effects are shown in FIG. 6. At fast withdrawal speeds, non-uniformities also occur. In this case, microlenses in the middle of the array have f#s that deviate a great deal from the average value. An optimum withdrawal speed between these two extremes exists at which the uniformity of an array of microlenses is maximized. In FIG. 7, the normalized variation in the focal length, $\Delta f/f$, for a row of fifteen 500 μm-diameter microlenses (fabricated with a single dip-coat) is plotted as a function of the substrate withdrawal speed for two monomer solutions. The more viscous monomer solution (Sartomer CD541), has a viscosity, $\mu$, of ~440 cP, and an optimum withdrawal speed of ~400 μm/s. The medium-viscosity monomer solution (Ciba 5180, $\mu$~200 cP), has an optimum withdrawal speed of ~1200 μm/s. At these optimums, microlens arrays made with both of these monomers had a uniformity of $\Delta f/f$~3.8%, corresponding to sag-height variations within the array of $\Delta h/h < \pm 2.5\%$. These values are competitive with leading microlens fabrication technologies. [In using the resist reflow process, there is a great deal of variability in the sag-height uniformity that can be achieved. Factors that affect the achievable uniformity include the microlens pitch, sag height, fill factor and microlens size. Typical sag height variations range from $\Delta h/h \sim \pm 2\% - \pm 10\%$ per Mr. John Rauseo, MEMS Optical Inc., 205 Import Circle, Huntsville, Ala. 35806 USA, in a personal communication to the inventors dated Dec. 13, 2000.]

The uniformity of microlens arrays fabricated with multiple dip-coats is also improved by withdrawing the substrate at an optimum speed. Using the Sartomer CD541 monomer solution and withdrawing the substrate at the optimum withdrawal speed of ~400 μm/s, an array of 500 μm-diameter f/1.38 microlenses was fabricated using multiple dip-coats with a uniformity of $\Delta f/f$~±5.9% ($\Delta h/h < \pm 4.5\%$).

The reproducibility of the microlens fabrication process was characterized. Five small-fill-factor (hydrophilic:hydrophobic area ratio of 0.25) microlens arrays containing 500 μm diameter microlenses were fabricated using a single 0-degree-tilt dip-coat in the high-viscosity monomer (Sartomer CD541, $\mu$~440 cP). The substrates were withdrawn at the optimum withdrawal speed of ~400 μm/s. The average f# of microlenses in these five arrays varied from a minimum of 3.88 to a maximum of 4.02. Thus, the average f# of an array of microlenses was reproducible to within (4.02-3.88)/3.95~3.5%. The apparatus used to withdraw substrates from the monomer solution did not allow strict control of substrate-withdrawal-angle; with better control, reproducibility may possibly be improved.

In addition to the microlens focal length, array uniformity, and reproducibility, there are other microlens characteristics that are of interest, including the microlens diameter, the microlens surface shape (spherical vs. aspherical), the roughness of the microlens, and the aberrations that result. These characteristics are largely independent of the fluid transfer process.

The microlens diameter is defined only by the size of the hydrophilic domains patterned within the hydrophobic background. The withdrawal speed, tilt angle, array fill factor, monomer viscosity and monomer surface tension affect the amount of monomer deposited during fabrication, but not the size of the microlens footprint. Even multiple dip-coats do not affect the microlens diameter; additional monomer assembles only on the existing cured microlens, a fact that was verified using both optical and atomic force microscopy.

The general shape and surface roughness of microlenses formed with our technique are also independent of the fluid transfer process. As the monomer assembles on the hydrophilic domains, it forms smooth, spherical caps under the influence of surface tension, regardless of the choice of monomer solution, the withdrawal technique, and the number of dip-coats used. The caveat is that the microlens must remain small (<~1000 μm in diameter) so that gravity does not influence the shape of the resulting microlens. FIG. 8 shows optical and atomic force microscope pictures of typical 50 μm diameter microlenses formed with single and multiple dip coats using our fabrication process. It can be seen that the surface profiles of the microlenses are quite smooth. Optical profiles (not shown) of such microlenses indicate that they deviate from spherical by just ±5 nm for single-dip microlenses and by <±15 nm for multiple-dip microlenses.

Because the microlenses formed with this technique have excellent surface profiles, with small deviations from spherical and very little surface roughness, aspherical aberrations will be minimized. Also, since most of the potential applications for microlenses involve only on-axis imaging, only spherical and chromatic aberrations will generally be important. Chromatic aberrations can be eliminated through proper selection of a monomer with an index of refraction that is wavelength insensitive over the range of interest. Thus, only spherical aberration is of particular concern. Computer simulations, conducted with Code V software (available from Optical Research Associates, Pasadena, Calif., USA) were used to determine the point-spread function encircling 84% of the focused energy for various microlenses. The point-spread function was shown to range from ~8.2 μm for f/4 microlenses to ~47 μm for f/1.38 microlenses. These values correspond to approximately 2× and 28× the diffraction-limited size of the central Airy disk. If such aberrations cannot be tolerated, input apertures could be fabricated to eliminate non-paraxial rays.

1.2. Theoretical Modeling of the Microlens Formation Method 1.2.1 Background

In order to understand the trends that have been observed experimentally, it is necessary to consider the process by which fluid is transferred to the hydrophilic domains of a heterogeneously-wettable substrate as it is withdrawn from a liquid bath.

Schwartz, et al., have considered the movement of a liquid layer over a heterogeneous substrate, comprised of a regular "patches" of low energy (hydrophobic) material within a background of high-energy (hydrophilic) material. See L. Schwartz, "Hysteretic Effects in Droplet Motions on Heterogeneous Substrates: Direct Numerical Simulation", Langmuir 14, 3440-3453 (1998); also Schwartz, R. Eley, "Simulation of Droplet Motion on Low-Energy and Heterogeneous Surfaces", Journal of Colloid and Interface Science 202, 173-188 (1998).

Numerical methods were used to solve the Navier Stokes equations (momentum conservation for fluids) for the speed, u(x,y,t) or height, h(x,y,t), of the liquid layer, at a given location and time on the substrate. The drawback of this approach is that because there is no analytical solution for these functions, a qualitative assessment of the factors that affect them is not (presently) possible. An alternative approach is to separately consider liquid flow on homogeneous hydrophilic and hydrophobic plates and then merge these results to obtain an approximate analytic solution for fluid flow on a heterogeneous substrate. This is the approach adopted in this specification.

As a clean homogeneous plate is withdrawn from an (uncontaminated) liquid bath, the solid-liquid interaction is characterized by a spreading coefficient, given by Equation 1:

$$S_{SL} = \sigma_{SV} - \sigma_{SL} - \sigma_{LV} \quad \text{Equation 1}$$

See Modern Approaches to Wettability: Theory and Applications, M. Schrader, G. Loeb, editors, (Plenum Press, New York, 1992). Here the $\sigma$s represent the interfacial free energies per unit area (surface free energies) of the solid-vapor, solid-liquid, and liquid-vapor interfaces. The liquid-vapor surface free energy is also referred to as the liquid surface tension. The plate will be wet by the liquid if the spreading coefficient is positive, and for the purposes of this specification this will be considered the criterion for a hydrophilic substrate. Conversely, a substrate will be hydrophobic if the spreading coefficient is negative.

The dip-coating of a homogeneous hydrophilic substrate, withdrawn vertically from a flat pool of an incompressible Newtonian fluid at a controlled speed, will result in the accumulation of a liquid layer on the hydrophilic surface. The thickness of this film of liquid was first approximated by Landau and Levich. See Landau and Levich, "Dragging of a Liquid by a Moving Plate", Acta Physicochimica U.R.S.S. 17, 43-54 (1942). The thickness of this film of liquid is given by Equation 2:

$$t = 0.946 \frac{(\mu U)^{2/3}}{(\rho g)^{1/2}} \left(\frac{1}{\sigma_{LV}}\right)^{1/6} = 0.643 \left(\frac{3\mu U}{\sigma_{LV}}\right)^{2/3} (R) \quad \text{(Equation 2)}$$

Here $\mu$, $\rho$, and $\sigma_{LV}$ are the liquid viscosity, density, and surface tension respectively, g is the acceleration due to gravity, and U is the speed of substrate withdrawal. R is the radius of curvature of the static-meniscus region, which can be shown to be equal to $(\sigma_{LV}/2\rho g)^{1/2}$. See Landau and Levich, supra.

In contrast, a hydrophobic plate withdrawn from a solution will not accumulate a liquid layer on its surface. Rather, the liquid will slip down the substrate. The slip speed, u, between the liquid and substrate at the liquid/substrate interface, is often assumed to be directly proportional to the sheer rate via a slip-length-that is: $u=\lambda(\partial u/\partial y)$ where $\lambda$ is the slip length, and y is the distance perpendicular to the substrate surface. See L. M. Hocking, "Sliding and Spreading of Thin Two-Dimensional Drops", Quarterly Journal of Mechanics and Applied Mathematics 34, 37-55 (1981). See also P. Thompson, and S. Troian, "A general boundary condition for liquid flow at solid surfaces", Nature 389, 360-362 (1997).

With this assumption, and with the additional assumptions that the slip speed is small and that the force of gravity is small compared to the liquid surface tension, the maximum speed with which a two dimensional liquid drop having lateral dimension $a_0$ will slip down a hydrophobic substrate is given by:

$$u = \frac{(a_0 \Theta_0)^2 \rho g}{\mu \log\left(\frac{2 a_0 \Theta_0}{3\lambda}\right)} \quad \text{Equation 3}$$

Here, u is the maximum speed with which the drop slips, and should not be confused with the substrate withdrawal speed, U. The density and viscosity of the liquid are represented by $\rho$ and $\mu$ respectively, and g is the acceleration due to gravity. See L. M. Hocking, supra. The slip length, $\lambda$, can be made large by making $\sigma_{SL}$ small (i.e. by making the substrate more hydrophobic). See P. Thompson and S. Troian, supra. See also B. Jean-Louis, "Large Slip Effect at a Nonwetting Fluid-Solid Interface", Physical Review Letters 82, 4671-4674 (1999).

$\theta_0$ is the contact angle of the liquid drop resting on the hydrophobic surface, and is given by the following equation 4:

$$\cos\Theta_0 = \frac{\sigma_{SV} - \sigma_{SL} + \left(\frac{\tau}{r}\right)}{\sigma_{LV}} \quad \text{Equation 4}$$

where $\sigma_{LV}$, $\sigma_{SV}$, and $\sigma_{SL}$ are the surface-free energies (or equivalently, surface tensions) of the liquid-vapor, substrate-vapor, and substrate-liquid interfaces, respectively. '$\tau$' is the "line tension" of the three-phase contact line, where the solid, liquid, and vapor phases meet, and 'r' is the radius of the base of the drop. See B. Widom, "Line Tension and the Shape of a Sessile Drop", J. Phys. Chem. 99, 2803-2806 (1995). In general, for small volumes of liquid, the line-tension can have a profound effect upon the equilibrium contact angle. See B. Widom, supra. However for the liquid volumes and monomer surface tensions that we utilized in our experiments, the line-tension is small and may be ignored. Equation 4 then reduces to the well-known Young-Dupre equation. See J. Pellicer, J. Manzanares, and S. Mafe, "The physical description of elementary surface phenomena: Thermodynamics versus mechanics", Am. J. Physics 63, 542-547 (1995); and F. Behroozi, H. Macomber, J. Dostal, C. Behroozi, and B. Lambert, "The Profile of a Dew Drop", Am. J. Phys. 64, 1120-1125 (1996).

From this equation 4, it is evident that the contact angle at the liquid-solid interface can be increased by decreasing $\sigma_{SV}$, (i.e. making the substrate more hydrophobic), or by increasing $\sigma_{LV}$ (i.e. increasing the liquid-air surface tension).

The speed, u, given by Equation 3 represents the speed with which an isolated liquid drop, having a constant volume (with lateral dimension $a_o$), will slip down a uniform hydrophobic substrate. It is not directly applicable to a dip-coating process in which the volume of liquid pulled up from the bath is a dynamic quantity. Nonetheless, Equation 3 is useful in describing the general trends exhibited in the dip-coating of hydrophobic substrates.

1.2.2 Heterogeneous Plate

Liquid draining from the hydrophobic areas of a heterogeneous substrate will follow the same trends as liquid draining from a purely hydrophobic substrate. i.e. the trends will be given by Equation 3. For instance, an increase in the monomer contact angle, or a decrease in monomer viscosity will result in an increased drain speed.

However on a heterogeneous substrate, hydrophilic domains also exist that will slow the draining liquid as it rolls off the substrate, and the distribution of these hydrophilic domains will affect how the monomer drains. Monomer solution draining from the middle of an array of hydrophilic domains will "feel" more hydrophilic material, and drain slower than will monomer solution draining at the left and right array edges, where a purely hydrophobic environment exists to one side. At the center of the array, where the drain speed reaches a minimum, the drain speed is denoted $U0_{drain}$, and is a function of the amount of hydrophilic material that exists (i.e. the array fill factor). At the left and right edges of the array the drain speed will attain a maximum value of $UE_{drain}$. This maximum value of the drain speed is essentially the same as the drain speed of a liquid on a purely hydrophobic substrate, and follows the trends of Equation 3.

Although it is not explicitly indicated, it should be remembered that $U0_{drain}$ is a function of the array fill factor, and that both $U0_{drain}$ and $UE_{drain}$ are functions of the monomer viscosity and surface tension (Equation 3 and Equation 4). Thus, the value of $U0_{drain}$ is specific to a given array fill factor, and both $U0_{drain}$ and $UE_{drain}$ are specific to a given monomer solution.

For a given array fill factor and monomer solution, if the substrate is withdrawn at a speed that is less than or equal to $U0_{drain}$, then the withdrawal speed and drain speed will be one and the same. On the other hand, if the substrate withdrawal speed is equal to or greater than the maximum drain speed of the liquid, $UE_{drain}$, then the liquid will drain at a rate given roughly by Equation 3, independent of further increases in the substrate withdrawal speed. These two possibilities define two different regimes for the heterogeneous plate, and it is predicted that very different trends will be observed in these two regimes.

In the first regime, the substrate is withdrawn at a speed that is less than or equal to $U0_{drain}$. The withdrawal speed is therefore the same as the drain speed. In this regime, the amount of liquid that is deposited on the hydrophilic domains will follow the trends given by Equation 2. Specifically, increasing monomer viscosity or substrate withdrawal speed, or decreasing monomer surface tension will give rise to an increase in the sheer force exerted on the monomer solution, which in turn will cause more solution to remain on the substrate.

In the second regime, the substrate is withdrawn at a speed that is equal to or greater than $UE_{drain}$. Increasing the substrate withdrawal speed further will not have an affect on this drain speed—the liquid will drain at a maximum speed, $UE_{drain}$, given roughly by Equation 3, regardless of how fast the substrate is withdrawn. The liquid layer thickness that can be deposited at this maximum drain speed can be found by inserting Equation 3 into Equation 2. The following expression (Equation 5) results:

$$t \sim \frac{(a_0 \Theta_0)^{4/3} \left(\frac{\rho g}{\sigma}\right)^{1/6}}{\left[\log\left(\frac{2 a_0 \Theta_0}{3\lambda}\right)\right]^{2/3}} \qquad \text{Equation 5}$$

Here, t is the thickness of the liquid adhering to the hydrophilic domains, and all other parameters have been previously defined.

Equation 5 shows that, as expected at the maximum drain speed, the thickness of the liquid layer on the hydrophilic domains is independent of further increases in substrate withdrawal speed. From this equation 5 it can also be observed that at this maximum drain speed, the liquid layer thickness will no longer be influenced by the liquid viscosity. This can be understood because as the monomer viscosity increases, the sheer force at any given withdrawal speed increases, (Equation 2), but the maximum drain speed, $UE_{drain}$, decreases (Equation 3), and these two effects tend to cancel. Equation 5 also predicts, however, that the contact angle (partially determined by the surface tension of the monomer), and the slip coefficient (partially determined by the surface tension of the solid/liquid interface) will govern the liquid thickness that can be achieved.

1.3 Comparison of Theory with Reality

As predicted by theory, liquid draining from the heterogeneous substrate followed trends given by Equation 3. Increases in the monomer contact angle (surface tension), and decreases in monomer viscosity resulted in increased drain speeds. See Table 1.

The amount of liquid that is deposited on each hydrophilic domain is directly related to the f# of the resulting microlens; more monomer deposition results in a stronger (lower f#) microlens. Thus, in regime 1, in which liquid deposition is governed by Equation 2 it is predicted that as the withdrawal speed is increased from zero, the microlens f# will start off very large, and get progressively smaller as the withdrawal speed is increased up to $U0_{drain}$. In this regime, it is also predicted that for a given withdrawal speed, monomers with large viscosities and small surface tensions will result in stronger (lower f#) microlenses. These are precisely the trends that were observed experimentally in the graph of f# vs. withdrawal speed (FIG. 2).

As the withdrawal speed is increased further, past $UE_{drain}$, theory predicts the beginning of regime 2. In this regime, the microlens f# will be minimized at a constant value, independent of further increases in withdrawal speed (Equation 5). Equation 5 further predicts that the minimum achievable f# should be independent of viscosity but highly dependent on monomer surface tension.

By experimental observation it was found that the minimum f# occurred at a withdrawal speed of $U0_{drain}$ and increased slightly before becoming constant at higher speeds. This surprising result can be understood because the value of $U0_{drain}$ is actually a dynamic quantity. If the substrate is withdrawn at a speed $\leq U0_{drain}$, the surface tension of the monomer pool exerts a pull on the draining monomer that slightly increases the value of $U0_{drain}$. On the other hand, if the substrate is withdrawn at a speed $> U0_{drain}$, the draining liquid is further removed from the surface of the monomer pool and the value of $U0_{drain}$ is reduced. Thus, the average f# of formed microlenses is minimized at a withdrawal speed of $U0_{drain}$ because this is the fastest speed with which monomer can drain. This was not predicted by theory because the equations we used were for isolated liquid drops, and the effect of the monomer pool was therefore not considered theoretically. At withdrawal speeds $> U0_{drain}$, however, the f# of formed microlenses does become constant (FIG. 2, Sartomer CD541), in agreement with theoretical predictions.

Experimentally, it was found that the minimum achievable f# could be made smaller by increasing monomer viscosity or surface tension (Table 1). However from Table 1 it can also be seen that the minimum f# was far more sensitive to changes in surface tension than in viscosity. For instance the Sartomer SR601 monomer solution has a viscosity that is more than double that of the Sartomer CD541 solution, but approximately the same surface tension. The additional liquid layer thickness deposited by the more viscous monomer is small (4 µm). On the other hand, the glycerol/water solution has a viscosity very similar to the Sartomer CD541 solution, but almost double the surface tension. The additional layer thickness deposited by the glycerol/water solution is large (11 µm). Thus, the experimental results differ from theory in that viscosity does affect the minimum achievable f#. However the relative insensitivity of the minimum f# to changes in viscosity compared to changes in surface tension is in keeping with theoretical predictions.

Equation 2 and Equation 5 implicitly indicate that the f# of formed microlenses will be a function of the microlens array fill factor. This is because, as discussed, arrays with high fill factors will have a smaller $U0_{drain}$ than arrays with low fill factors. At withdrawal speeds greater than $U0_{drain}$ (when arrays of all fill factors are in regime 2) the average f# of microlenses formed on high fill factor arrays will therefore become constant at a larger value (the microlenses will be weaker) than arrays with low fill factors. This trend can be seen in the experimental results of FIG. 4 in which low fill-factor arrays clearly give rise to microlenses with lower f#s at high speeds. However FIG. 4 also shows the at low withdrawal speeds, less than $U0_{drain}$, the same trends exist. This is not explained by the model, which predicts that the f#s of microlenses formed at speeds less $U0_{drain}$ should be independent of fill factor. The explanation for this discrepancy is that as the monomer solution rolls off the hydrophobic areas of the substrate, it must either drain from the substrate, or "snap back" onto the hydrophilic domains. Monomer solution draining from arrays with large fill-factors does not snap back, but instead drains towards the adjacent (close) row of hydrophilic domains. In contrast, more monomer solution accumulates on the hydrophilic domains of arrays with small fill-factors, resulting in stronger (lower f#) microlenses even at low withdrawal speeds.

The equations for liquid layer thickness (Equation 2 and Equation 5) do not contain any terms that constrain the size of the hydrophilic domains. It is therefore predicted that for a given microlens shape (e.g. circle, square, etc.), increasing the size of the microlens should not appreciably affect the microlens the f# provided that the fill factor of the array is maintained constant. This prediction was confirmed experimentally by the relative insensitivity of f# with microlens diameter (FIG. 5).

Finally, the f# of formed microlenses will also depend on the substrate dipping angle due to the affect that the dipping angle has on the shape of the static meniscus. If the substrate is tilted at an angle, the radius of curvature of the static meniscus on the top side of the plate is made larger, while the radius of curvature of the static meniscus on the bottom-side of the plate becomes smaller. From Equation 2 it can be seen that these changes in the radius of curvature of the static meniscus will cause a thicker liquid layer to be deposited on the top side, while reducing the thickness of the deposited layer on the bottom side. Thus it is expected that if the patterned side of the substrate is tilted up, stronger (lower f# microlenses) will result. This prediction was confirmed experimentally.

Figure 9:
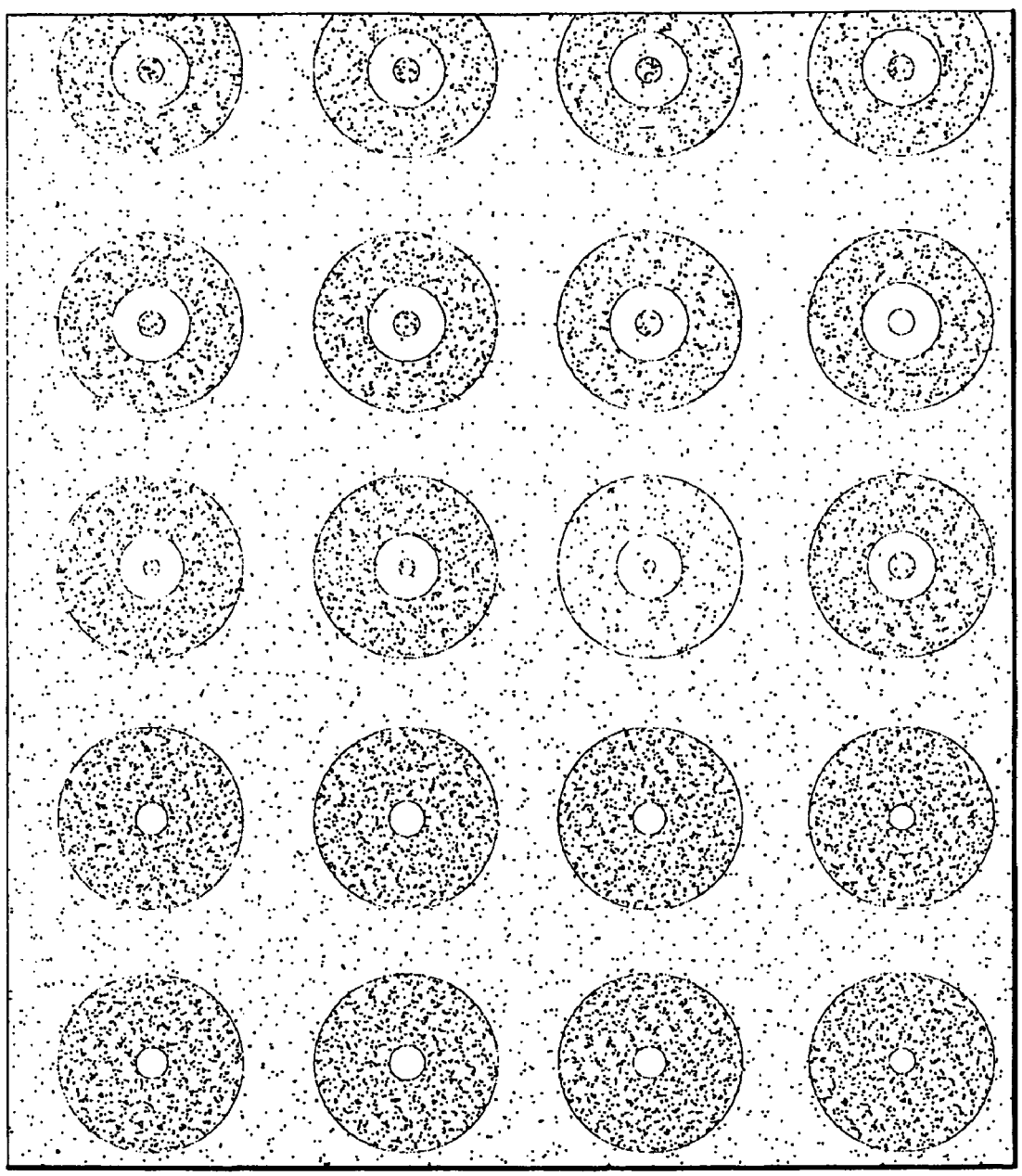
FIG. 9 is a picture of an array of microlenses.

Two factors will influence the achievable uniformity of the microlens arrays. First and foremost, of these factors is the shape of the three-phase (solid-liquid-air) contact line as it rolls off the substrate. At the left and right edges of an array of hydrophilic domains there will exist an asymmetrical distribution of hydrophilic area, and the three-phase contact line will be deformed (FIG. 9). More monomer solution will drain from the substrate at these edges, leading to a decrease in liquid volume remaining on the hydrophilic spots, and a corresponding increase in the f# of microlenses at the left and right edges. These predicted edge effects are in accordance with the experimental results of FIG. 6, though it was found that they occurred preferentially at low withdrawal speeds. One possible reason why edge effects tend not to occur at high speeds is that at high speeds the three-phase contact line does not have time to deform to the extent that it does at low withdrawal speeds.

The shape of the three-phase contact line will also affect the uniformity of the central part of microlens arrays (away from the left and right edges). If the substrate is withdrawn from the monomer solution at a speed no greater than $U0_{drain}$ (regime 1) then a straight solid-liquid-air contact line will be preserved across the entire substrate (except at the edges), and the monomer will drain smoothly, generating a uniform microlens array. On the other hand, if the substrate is withdrawn at a speed greater than $U0_{drain}$, the three-phase contact line will be deformed, and monomer will drain non-uniformly, leading to non-uniformities in the f#s of the microlenses that result.

The second factor that will contribute to array non-uniformity will be that at low speeds, a relatively small amount of monomer solution will be deposited in each hydrophilic domain. Because the microlenses thus formed have a small volume, they will be quite sensitive; small microlens-to-microlens volume differences will influence their focal length significantly, resulting in a microlens array that is more non-uniform than one fabricated at a higher speed.

On the basis of this discussion, the existence of an optimum withdrawal speed, at which the standard deviation of the focal length of microlenses in an array is minimized is predicted. This optimum was experimentally verified, and shown to occur at a withdrawal speed $U0_{drain}$. At this speed, the microlens volume is maximized, and the monomer drains as smoothly as possible from the substrate.

On the basis of our experiments and our theoretical analysis, we summarize the requirements which allow the manufacturing of high-performance (i.e. low f#), uniform and reproducible microlens arrays utilizing the hydrophobic effect:

1) To produce single-dip low f# microlenses:
   a) The substrate withdrawal speed should be made equal to $U0_{drain}$. Increasing the substrate withdrawal speed further will result in a slight increase in f#.
   b) A large drain speed, $U0_{drain}$, is desired. To maximize the drain speed:
      i) A large liquid-solid contact angle is desirable on the hydrophobic regions of the substrate. This can be achieved by decreasing the energy of these regions (by using a more hydrophobic adhesive layer), or by increasing the monomer surface tension.
      ii) A large slip coefficient, λ, is desired. λ can be made large by minimizing the substrate-liquid interface energy (by using a more hydrophobic adhesive layer).
   c) A viscosity greater than or equal to ~200 cP is desired. Theoretically, at speeds equal to or greater than $UE_{drain}$, the layer thickness (and hence the resulting microlens f#) should not depend on viscosity. Experiments show however that a viscosity of ~200 cP or greater is needed to minimize f#.
2) To maximize uniformity:
   a) To prevent severe defects, hydrophilic and hydrophobic regions of the substrate must have positive and negative spreading coefficients, respectively (Equation 1).
   b) The number of conjoined microlenses can be reduced by making the fill factor of the array smaller. If this is not an option, withdrawal speed and/or monomer viscosity must be reduced.
   c) Assuming a small enough fill factor that conjoined microlenses are not generated, substrates should be withdrawn at $U0_{drain}$, the maximum speed with which liquid can drain from the central portion of the array, while still preserving a uniform three-phase contact line.
   d) Extra "dummy" microlenses should be fabricated to the left and right sides of an array so that edge effects can be ignored. This is particularly important in high-fill-factor arrays, where the withdrawal speed must be kept small ($<U0_{drain}$) to avoid production of defects.

3) For best reproducibility, careful control of substrate dipping angle is required.

1.4 Summary of Basic Microlens Fabrication Method of the Present Invention

In summary, the performance of polymer microlens arrays fabricated by dip-coating patterned hydrophilic/phobic substrates was quantitatively analyzed and optimized. At low withdrawal speeds the average f# of formed microlenses could be reduced by increasing substrate withdrawal speed or monomer viscosity, or by decreasing monomer surface tension. At larger withdrawal speeds, the average f# was minimized and become constant, independent of withdrawal speed. The minimum f# was achieved at a withdrawal speed $U0_{drain}$ corresponding to the maximum speed with which monomer solution can drain smoothly from the substrate while still preserving a straight liquid-air-solid contact line. The minimum achievable f# could be reduced by using a monomer with a large viscosity and large surface tension. At all withdrawal speeds, the f#s of formed microlenses could be reduced by decreasing the array fill factor or by tilting the substrate so that its patterned side was tilted up during the withdrawal process. Dynamic control of the withdrawal speed allowed microlenses having the same diameter but different f#s to be fabricated within the same array. Uniformity of microlens arrays was analyzed with an eye to both reducing defect density and minimizing microlens-to-microlens variations in arrays. The number of conjoined microlenses was reduced by making fill factors sufficiently small, or by reducing the monomer viscosity or withdrawal speed. The number of missing and misshapen microlenses was reduced by ensuring that the monomer surface tension was small enough that the monomer fully wet the hydrophilic domains. In microlens arrays in which defects were not a problem, $U0_{drain}$, was shown to be the optimum withdrawal speed at which array uniformity was maximized. At this optimum, arrays of f/3.48 microlenses were fabricated using one dip-coat with uniformity better than $\Delta f/f \sim \pm 3.8\%$. Multiple dip-coats allowed production of arrays of f/1.38 microlenses with, uniformity better than $\Delta f/f \sim \pm 5.9\%$. Average f#s were reproducible to within 3.5%. Other microlens characteristics such as the diameter, shape, and surface roughness of the microlenses were shown to be excellent, and independent of the fluid transfer process. A model was developed to describe the fluid transfer process by which monomer solution forms microlenses on the hydrophilic domains. Good agreement between theory and experimental results was found.

The technique we have developed for the fabrication of microlenses offers several advantages over more conventional methods (resist-reflow, ink-jet, etc.). First, it is extremely low-cost, requiring only a mask, and a UV source for the lithographic exposures. Since there is only one masking step, there is no need for an expensive mask aligner. Second, all processing may be performed at room temperature, allowing integration of microlenses with temperature sensitive materials and components. Third, the polymer microlenses are directly fabricated from robust, optically-transparent polymers, eliminating the need for an etch transfer step (though such etch transfers may be performed if desired). Finally, our process appears to be competitive with other technologies in offering lithographic-alignment, low-f#s, large fill-factors, spherical surface profiles, and excellent array uniformity and reproducibility. There are, of course, limitations in the technique. For instance, some substrate-liquid systems do not meet the criteria of Equation 1, and such systems are unsuitable for microlens fabrication. Also, the fabrication of uniform high-fill-factor arrays can be tricky, since it is often necessary to withdraw such substrates below the optimum speed to ensure defect-free arrays. Nonetheless, we feel that for many applications our technique is competitive and in some cases superior to existing microlens fabrication technologies.

2. Fabricating Microlenses in Self-Alignment to Optical Components

An extension and adaptation of the microlens fabrication method of the present invention permits the ready fabricating microlenses which are self-aligned to optical fibers and low-wavelength (<500 nm) single-mode light output devices. Unlike most integration techniques, our fabrication method allows the production of self-aligned microlenses both directly on optical components and removed from these components by a spacer. This later capability is, to the best knowledge of the inventors, unique.

Additionally, the extended fabrication method of the present invention requires very little equipment, no heat, and only an optional etch-transfer step over the basic method, making our integration method extremely low-cost. Microlenses integrated with fibers have optical-quality smooth surfaces, deviating from spherical by just ±15 nm over their centers. These microlenses have f#s as low as 1.55 and, because they are self-aligned, can be integrated in optical systems that require alignment tolerances that would be impractical using any other technique (known to the inventors). As just previously stated, two-dimensional arrays of such microlenses can be made with excellent uniformity ($\Delta f/f \sim 5.9\%$ for a 15×15 array of 500 μm f/1.4 microlenses), stability, and reproducibility (average f#s are reproducible to within 3.5%).

Figure 10:
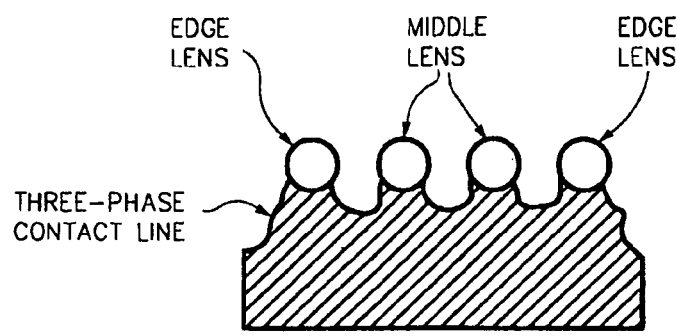
FIG. 10 is a diagrammatic representation of a three-phase contact line as it rolls-off the substrate; the contact line is symmetrical in the middle and asymmetrical at the edges.

FIG. 10, consisting of FIGS. 10a through 10f, diagrammatically illustrates our extended method of the present invention for the fabrication of a single microlens self-aligned to an optical fiber on a glass spacer. First, an adhesive hydrophobic layer is mechanically applied to a transparent substrate, and photoresist is spun over this layer. Next, the substrate is glued perpendicularly to the end of an optical fiber using an optically transparent adhesive. After the adhesive dries, light is shined through the optical fiber, exposing the photoresist only at the fiber output. The hydrophobic layer is now etched away from the exposed region, using an $O_2$ plasma etch, and the remaining photoresist is then stripped, leaving a hydrophilic domain patterned just above the fiber output in a hydrophobic background. If the substrate is then dipped into and withdrawn from a UV-curable-monomer solution, the monomer will self-assemble into a microlens on the hydrophilic domain. After a UV-cure the microlens becomes hard and stable. After curing, if a stronger (lower f#) microlens is desired, the substrate may be re-dipped into the monomer solution. Additional monomer solution assembles on top of the existing cured microlens, causing an increase in the radius of curvature, and a corresponding reduction in f#. This process of curing and re-dipping may be used repeatedly to reduce the f# of the fabricated microlens. The technique for integrating microlenses directly on fibers (with no spacer) is much the same. The fiber end is mechanically coated with a hydrophobic material, and photoresist is then simply dabbed (not spun) over this hydrophobic layer. The remainder of the procedure is as described above. Although dabbing the photoresist onto the fiber gives rise to a non uniform resist layer, high quality microlenslets can nonetheless be formed with this technique.

Commercial high-wavelength photoresists are designed for optimum exposure at wavelengths<500 nm. On the other hand, optical fibers for communication are designed to carry higher wavelengths (850, 1310, and 1550 nm). This difference has two important implications in our procedure. First, it means that during the microlens-writing process, there will be significant optical power loss as the light propagates through the fiber. To address this concern a more intense writing light can be used, or short optical fibers can be used during the write process, and then spliced to longer fibers after the microlenses are formed. The second problem is that at short wavelengths, optical communication fibers support multiple modes. If coherent laser light from (for example) and Ar source ($\lambda$=488 nm) is used to expose the resist through the fiber, non-circular mode patterns are formed in the resist. Microlenses formed from such footprints are highly aberrated. The solution to this problem is to couple white light into the fiber during the exposure. The white light produces a very large number of modes in the fiber, resulting in the "smearing" of mode patterns, and the generation of a circular footprint in the resist.

It is generally desirable to fabricate a microlens with a diameter that is larger than the output beam size (i.e., larger than the $1/\exp^2$ beam diameter). This can be achieved by writing the microlens with a beam intensity that is greater than the desired operating intensity. During the writing process the beam diameter will be large and will generate a large microlens footprint. During operation the beam diameter will be smaller, and will under-fill the microlens so that the microlens captures a maximum amount of the beam power.

The precise diameter of the exposed-footprint depends on a number of factors, including the intensity and wavelength content of the illumination light being used, the fiber core size, the spacer size, the sensitivity of the particular photoresist used, and the exposure time. A very good estimation, however, can be obtained from a knowledge of the numerical aperture of the fiber. The diameter of the exposed footprint is approximated by Equation 6:

$$D=d+2(1/n)\tan(\text{SIN}^{-1}(\text{N.A.}))\qquad\text{Equation 6}$$

Here D is the size of the exposed footprint, d is the core diameter, l is the glass spacer thickness (the distance between the output of the fiber and the resist layer), n is the index of refraction of the glass spacer, and N.A. is the numerical aperture of the fiber.

In our experiments we used Corning Single Mode Optical Fiber SMF 28. The core diameter of this fiber is ~10 µm, and the numerical aperture is constant at about 0.14 over a wide wavelength range. (The N.A. of Corning Single Mode Optical Fiber SMF 28 is approximately constant from 500 nm-1300 nm. per a personal communication to the inventors of Nov. 24, 2000 from Corning, Inc., Telecommunications Products Division Technical Support, Corning, N.Y. 14831 USA.) Using glass microscope slides (l=1000 µm, n=1.5), we calculate a theoretical diameter for the footprint of the microlens of 198 µm.

Figure 11A:
FIG. 11, consisting of FIGS. 11a through 11f, is a diagrammatic representation of the flow of the adapted, and extended, method of the present invention for producing microlenses self-aligned to optical fibers through a transparent spacer.

Experimentally, we found that resist holes varied in size somewhat depending upon the intensity and length of the exposure. The size range of formed resist holes, however, was 175-200 µm in diameter, in good agreement with theoretical predictions. FIG. 11a shows a 175 µm diameter photoresist hole formed using the described conditions. This picture was taken at an angle so that the V-groove where the optical fiber rests and the photoresist hole are both visible. However the resist hole is perfectly self-aligned to the output of the optical fiber.

Figure 11B:
Figure 11C:
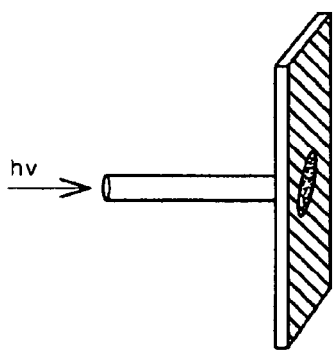
Figure 11D:
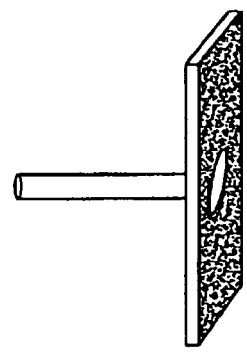
Figure 11E:
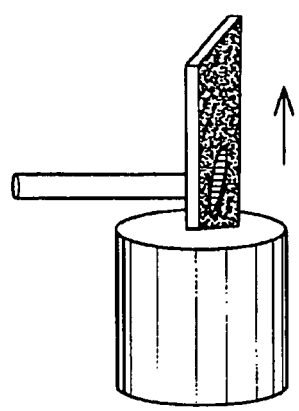
Figure 11F:
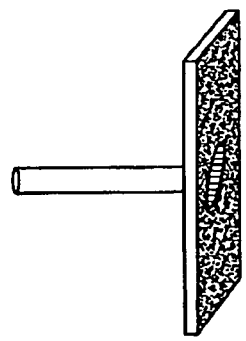

After $O_2$ plasma etching the substrate and then stripping the resist, the substrate was dipped into a polymer solution, allowing the formation of a microlens in the precise location where the resist hole was fabricated. This microlens is shown in FIG. 11b, and again (at higher magnification), in FIG. 11c. The microlens shown here was dipped and UV-cured multiple times in order to produce a strong (f/1.55) microlens.

Figure 12:
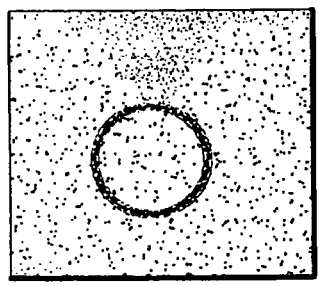
FIG. 12a is a microphotograph of a resist hole on 1.0 mm spacer glued to fiber made with white light exposure; a V-groove that the fiber rests in being visible.
FIG. 12b is a microphotograph of a 175 µm microlens on 1.0 mm glass spacer self-aligned to optical fiber; a V-groove that the fiber rests in again being visible.
FIG. 12c is a microphotograph close up of a microlens made in accordance with either the base, or extended, methods of the present invention.
Figure 12:
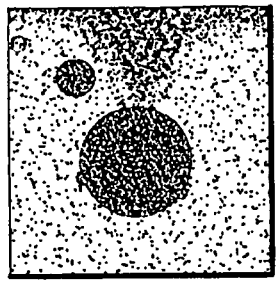
Figure 12:
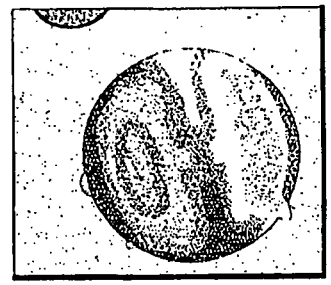
Figure 13:
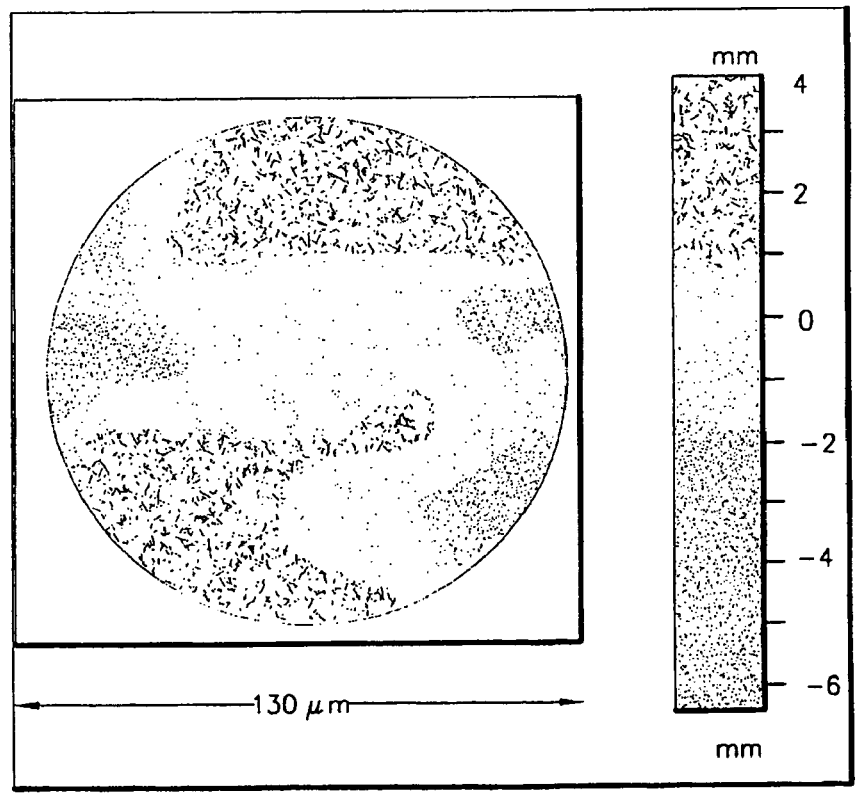
FIG. 13 is an error map of the profile of an exemplary microlens made in accordance with the extended method of the present invention, the error map showing deviation from spherical of the middle 50 µm of a 175 µm-diameter f/1.5 microlens that has been self-aligned to an optical fiber.

It can be seen that the microlens appears quite circular, though there are a few "spurs" on its circumference. Careful attention to index matching at the interfaces, perfectly-perpendicular alignment of the fiber at the fiber-spacer interface, and proper choice of photoresist and spacer materials may eliminate such non-uniformities. In any case, these spurs do not greatly affect the performance of the microlens. The surface profile of this particular microlens, for instance, was measured using optical interferometric techniques, and the microlens was found to deviate from spherical by just ±15 nm over its center (FIG. 12).

It is easy to extend this technique to the parallel fabrication of multiple self-aligned microlenses in two dimensional arrays. To do this, it is only necessary that light be transmitted through each fiber in the array so that the resist is exposed at each fiber output. The scheme for such a process uses a "writing array", consisting of an array of optical fibers with fiber connectors (FCs) at their ends. Light intensity at the output of each FC can be measured and adjusted appropriately. The fibers in the array of interest (on which we desire to fabricate microlenses) are now connected to the writing array with complementary FCs, and the exposure is allowed to occur. After the exposure, the array can be removed, a new array attached to the writing array, and the process repeated. With the use of the writing-array, it is only necessary to adjust the beam intensities through each fiber once. After this initial adjustment, identical arrays of microlenses can be fabricated on many fiber arrays.

A unique aspect of this fabrication process is that the footprint (and hence the focal length) of each microlens at each fiber output in the array can be tailored by careful selection of the intensity of light that is transmitted through each fiber during the writing process. For example, transmission of equal intensity light through each fiber will result in a uniform array of microlenses with the same focal length. On the other hand, adjacent microlenses can be fabricated with very different focal lengths, simply by transmitting different intensities of light through each fiber.

In summary, the expanded method of the present invention shows how to fabricate microlenses that are fully-self-aligned to optical fibers and low-wavelength (<500 nm) single-mode output devices. The method requires very little equipment, no alignment steps, and no heat. All of these factors contribute to making the method extremely low-cost. The method has been used to fabricate microlenses directly on the ends of optical fibers as well as on transparent spacers separated from the fibers. The microlenses so formed have excellent surface characteristics, deviating from spherical by just ±15 nm, and can be fabricated with f#s as low as 1.55. Because the microlenses are self-aligned, low f# microlenses can be integrated in optical systems that require alignment tolerances that would be impractical using any other technique. It is a simple matter to extend this method to the fabrication of arrays of microlenses each self-aligned to an individual fiber in a massively parallel fashion. Accordingly, while the base method or the present invention teaches that a parallel scheme can be used to generate uniform, stable reproducible arrays of microlenses, the enhanced method teaches that it is also possible to fabricate in a massively parallel fashion great numbers of microlenses that are sel-aligned to correspondingly great numbers of optic fibers or light sources. See also the inventors' own published papers: D. Hartmann, O. Kibar, and S. Esener, Optics Letters 25, 975, (2000); D. Hartmann, O. Kibar, and S. Esener, submitted to Applied Optics, (2000); and D. Hartmann, O. Kibar, and S. Esener, Optics in Computing, R. Lessard, T. Galstian, Ed., SPIE 4089, 496 (2000).

In accordance with the preceding explanation, variations and adaptations of the methods in accordance with the present invention will suggest themselves to a practitioner of the optical and optical device arts. For example, the monomer need not be cured with ultraviolet light, but may be cured by temperature, chemicals, or diverse other ways well known in the chemical arts.

As a more profound difference, it is known that conductive polymers can be transparent, and that transparent polymers may be conductive—as may be verified by a search for both terms in the full text issued patents of the United States as are available at the web site of the United States Patent and Trademark Office. It is thus perceived possible to produce on one substrate microlenses—primarily for optical communication—and bump pads—primarily for electrical connection—all at the same time by use of but one polymer precursor solution in but one single, unified, process. The value of making both electrical and optical connections—especially as are both simultaneously self-aligned—in a single process is obvious.

In accordance with these and other possible variations and adaptations of the present invention, the scope of the invention should be determined in accordance with the following claims, only, and not solely in accordance with that embodiment within which the invention has been taught.

What is claimed is:

1. A method of fabricating polymer microlenses comprising:
    selecting at least one of (i) liquid viscosity, (ii) liquid surface tension, (iii) liquid density, (iv) liquid index of refraction, (v) the surface-free-energies of the hydrophilic and hydrophobic areas of the substrate, (vi) the angle of substrate withdrawal, (vii) the speed of the substrate withdrawal, (viii) the proximity of hydrophilic areas to each other, and (ix) the number of any times the withdrawing is repetitively performed, so as to controllably fabricate a microlens with a desired f-number (f#);
    withdrawing a substrate of patterned wettability from a liquid polymer precursor to leave a pattern of liquid polymer precursor areas on the substrate to form caps of the liquid polymer precursor; and
    solidifying the liquid polymer precursor caps remaining on the substrate by curing the caps so as to form solid polymer microlenses,
    wherein the withdrawal speed is varied specifically so as to vary the f#s of polymer microlenses in different regions of the substrate.

2. The method of fabricating a plurality of microlenses according to claim 1 comprising mechanically applying an adhesive hydrophobic layer to the substrate by use of a polishing cloth.

3. The method of fabricating a plurality of microlenses according to claim 1, wherein the substrate is selected from a group consisting of Si, SiN, $SiO_2$, GaAs, InGaAs and InP.

4. The method of fabricating a plurality of microlenses according to claim 1, wherein the liquid polymer precursor comprises a UV-curable liquid monomer solution; and wherein the curing of the caps of curable monomer present upon the substrate is with UV light.

5. The method of fabricating a plurality of microlenses according to claim 1, wherein the liquid polymer precursor comprises a monomer solution ranging in viscosity from about 20 centipoise to about 2000 centipoise.

6. The method of fabricating a plurality of microlenses according to claim 2 comprising lithographically patterning of the hydrophobic layer into a plurality of regularly geometrically sized and related areas so that the plurality of microlenses ultimately formed by the curing are in a regular array.

7. A method of fabricating a plurality of microlenses comprising:
    applying an adhesive hydrophobic layer to a substrate;
    lithographically patterning the hydrophobic layer into a plurality of areas;
    selectively etching the patterned hydrophobic layer;
    selecting at least one of (i) monomer viscosity, (ii) monomer surface tension, (iii) substrate dipping angle, (iv) speed of substrate withdrawal, (v) fill factor of any array formed by proximate ones of the plurality of microlenses, (vi) the number of times the dipping, the withdrawing and the curing are repetitively performed, (vii) monomer solution density, and (viii) surface free energies of the hydrophobic and hydrophilic areas of the substrate, so as to controllably fabricate a microlens with a desired f-number (f#);
    dipping the substrate with its selectively etched patterned hydrophobic layer into a curable liquid monomer solution;
    controllably withdrawing the substrate from the solution so that, as the substrate is withdrawn, the liquid monomer solution drains from the hydrophobic areas of the substrate but remains on the hydrophilic areas, the solution forming in these hydrophilic areas caps under the influence of surface tension;
    curing the caps of curable monomer present upon the substrate so as to make a plurality of solid polymer microlenses; and after the curing,
    re-dipping the substrate with its plurality of polymer microlenses into the liquid monomer solution so that additional monomer solution assembles on top of the existing cured microlenses;
    re-withdrawing the substrate from the solution; and
    re-curing the newly-added curable monomer present upon the plurality of microlenses upon the substrate so as to make microlenses having decreased radii of curvature and a correspondingly reduced f#;
    said method of fabricating a plurality of microlenses further includes the fabrication of a plurality of microlenses that are self-aligned to a small light source including as appears at the ends of optical fibers and low-wavelength single-mode light output devices, the method including:
    applying to the adhesive hydrophobic layer on the substrate that is transparent a layer of photoresist;
    affixing the small light source to the substrate;
    using the light from the light source to expose the photoresist substantially only where it is affixed to the substrate;
    selectively etching to etch away the hydrophobic layer from the exposed region, followed by
    stripping the remaining photoresist, leaving a hydrophilic area in a hydrophobic background on the substrate in position opposite to light output from the affixed light source;
    dipping the substrate with its selectively etched patterned hydrophobic layer and affixed light source into a curable monomer solution; followed by
    controllably withdrawing the substrate from the solution; followed by curing the monomer as is upon the withdrawn substrate into polymer;
wherein the method is applied to produce each microlens of the plurality of microlenses upon the substrate in a shape, and in a size, of light output from the light source, and in position opposite the light source;
wherein each produced microlens of the plurality of microlenses to guide light emitted from the light source.

8. The method according to claim 1, wherein the polymer microlenses have an average f-number (f#) of about 3.48 or less.

9. The method of claim according to claim 1, wherein the polymer microlenses have an average f-number (f#) that is reproducible within about 3.5%.

* * * * *

UNITED STATES PATENT AND TRADEMARK OFFICE
CERTIFICATE OF CORRECTION

| | | |
|---|---|---|
| PATENT NO. | : 7,771,630 B2 | |
| APPLICATION NO. | : 09/792236 | |
| DATED | : August 10, 2010 | |
| INVENTOR(S) | : Daniel M. Hartmann et al. | |

It is certified that error appears in the above-identified patent and that said Letters Patent is hereby corrected as shown below:

On Page 2, in Field (56), under "OTHER PUBLICATIONS", in Column 2, line 32, please delete "Ouarterly" and insert -- Quarterly --, therefor.

On Page 2, in Field (56), under "OTHER PUBLICATIONS", in Column 2, Line 46, please delete "Fabricaed" and insert -- Fabricated --, therefor.

On Page 2, in Field (56), under "OTHER PUBLICATIONS", in Column 2, Line 47, please delete "Otpics" and insert -- Optics --, therefor.

On Page 2, in Field (56), under "OTHER PUBLICATIONS", in Column 2, Line 51, please delete "200," and insert -- 2001, --, therefor.

On Page 2, in Field (56), under "OTHER PUBLICATIONS", in Column 2, Line 58, please delete "processe," and insert -- processes --, therefor.

On Page 2, in Field (56), under "OTHER PUBLICATIONS", in Column 2, Line 68, please delete "93." and insert -- 93, --, therefor.

On Page 3, in Field (56), under "OTHER PUBLICATIONS", in Column 1, line 1, please delete "al." and insert -- al., --, therefor.

On Page 3, in Field (56), under "OTHER PUBLICATIONS", in Column 1, Line 10, please delete "al." and insert -- al., --, therefor.

On Page 3, in Field (56), under "OTHER PUBLICATIONS", in Column 1, Line 32, please delete "W.R.;" and insert -- W.R., -- therefor.

On Page 3, in Field (56), under "OTHER PUBLICATIONS", in Column 2, Line 14, please delete "1993." and insert -- 1993). --, therefor.

Signed and Sealed this
Tenth Day of May, 2011

David J. Kappos
*Director of the United States Patent and Trademark Office*

CERTIFICATE OF CORRECTION (continued)
U.S. Pat. No. 7,771,630 B2

On Page 3, in Field (56), under "OTHER PUBLICATIONS", in Column 2, Line 20, please delete "al," and insert -- al., --, therefor.

On Page 3, in Field (56), under "OTHER PUBLICATIONS", in Column 2, Line 25, please delete "al," and insert -- al., --, therefor.

On Page 3, in Field (56), under "OTHER PUBLICATIONS", in Column 2, Line 33, please delete "Me hanical" and insert -- Mechanical --, therefor.

In Column 7, Line 27, please delete "629-633" and insert -- 629-633. --, therefor.

In Column 10, Line 29, please delete "SiO2," and insert -- $SiO_2$, --, therefor.

In Column 15, Line 52, before "DESCRIPTION" please insert -- DETAILED --.

In Column 30, Line 67, please delete "sel-aligned" and insert -- self-aligned --, therefor.

In Column 31, Line 55, in Claim 2, please delete "1" and insert -- 1, --, therefor.

In Column 32, Line 4, in Claim 6, please delete "2" and insert -- 2, --, therefor.

In Column 34, Line 4, in Claim 9, please delete "The method of claim" and insert -- The method --, therefor.